(12) United States Patent
Chen et al.

(10) Patent No.: US 11,616,043 B2
(45) Date of Patent: Mar. 28, 2023

(54) CHIP TRANSFER METHOD, DISPLAY DEVICE, CHIP AND TARGET SUBSTRATE

(71) Applicant: BOE Technology Group Co., Ltd., Beijing (CN)

(72) Inventors: Liang Chen, Beijing (CN); Lei Wang, Beijing (CN); Minghua Xuan, Beijing (CN); Li Xiao, Beijing (CN); Dongni Liu, Beijing (CN); Detao Zhao, Beijing (CN); Hao Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 224 days.

(21) Appl. No.: 17/057,351

(22) PCT Filed: Feb. 11, 2020

(86) PCT No.: PCT/CN2020/074709
§ 371 (c)(1),
(2) Date: Nov. 20, 2020

(87) PCT Pub. No.: WO2020/215856
PCT Pub. Date: Oct. 29, 2020

(65) Prior Publication Data
US 2021/0134755 A1    May 6, 2021

(30) Foreign Application Priority Data
Apr. 24, 2019  (CN) .......................... 201910333482.5

(51) Int. Cl.
*H01L 23/00* (2006.01)
*H01L 25/16* (2006.01)
*H01L 33/62* (2010.01)

(52) U.S. Cl.
CPC .............. *H01L 24/81* (2013.01); *H01L 24/06* (2013.01); *H01L 24/14* (2013.01); *H01L 24/16* (2013.01);
(Continued)

(58) Field of Classification Search
CPC ......... H01L 24/81; H01L 24/06; H01L 24/14; H01L 24/16; H01L 24/17; H01L 25/167;
(Continued)

(56) References Cited

U.S. PATENT DOCUMENTS

2008/0023435 A1   1/2008  Wu et al.
2012/0049350 A1*  3/2012  Grillberger ......... H01L 21/4853
                                              257/737
(Continued)

FOREIGN PATENT DOCUMENTS

CN         104600176 A        5/2015
CN         106486492 A        3/2017
(Continued)

OTHER PUBLICATIONS

International search report of PCT application No. PCT/CN2020/074709 dated Apr. 22, 2020.
First office action of Chinese application No. 201910333482.5 dated Sep. 14, 2020.
Notification to grant patent right for invention of Chinese application No. 201910333482.5 dated Apr. 19, 2021.

*Primary Examiner* — Didarul A Mazumder
(74) *Attorney, Agent, or Firm* — Lippes Mathias LLP

(57) ABSTRACT

A chip transfer method including: disposing a target substrate in a closed cavity, the target substrate including a first alignment bonding structure and a second alignment bonding structure; applying a charge of a first polarity to the first alignment bonding structure of the target substrate; applying a charge of a second polarity to a first chip bonding structure of a chip; injecting an insulating fluid into the closed cavity to suspend the chip in the insulating fluid within the closed cavity; and applying a bonding force to the chip.

15 Claims, 14 Drawing Sheets

(52) U.S. Cl.
CPC ............ *H01L 24/17* (2013.01); *H01L 25/167* (2013.01); *H01L 33/62* (2013.01); *H01L 2224/06051* (2013.01); *H01L 2224/1403* (2013.01); *H01L 2224/14051* (2013.01); *H01L 2224/16145* (2013.01); *H01L 2224/1703* (2013.01); *H01L 2224/17051* (2013.01); *H01L 2224/81085* (2013.01); *H01L 2224/81139* (2013.01); *H01L 2224/81143* (2013.01); *H01L 2933/0066* (2013.01)

(58) Field of Classification Search
CPC ........... H01L 33/62; H01L 2224/06051; H01L 2224/1403; H01L 2224/14051; H01L 2224/16145; H01L 2224/1703; H01L 2224/17051; H01L 2224/81085; H01L 2224/81139; H01L 2224/81143; H01L 2933/0066
USPC .......................................... 257/737; 438/613
See application file for complete search history.

(56) References Cited

U.S. PATENT DOCUMENTS

| | | | | |
|---|---|---|---|---|
| 2013/0062757 | A1* | 3/2013 | Feger | H01L 24/13 257/737 |
| 2015/0091187 | A1* | 4/2015 | Reber | H01L 24/16 438/109 |
| 2017/0059906 | A1* | 3/2017 | Cho | G02F 1/1339 |
| 2017/0062492 | A1* | 3/2017 | Bae | H01L 25/167 |
| 2018/0025966 | A1 | 1/2018 | Hwang et al. | |
| 2018/0269328 | A1 | 9/2018 | Park | |
| 2019/0148611 | A1 | 5/2019 | He et al. | |

FOREIGN PATENT DOCUMENTS

| | | |
|---|---|---|
| CN | 107425101 A | 12/2017 |
| CN | 108682312 A | 10/2018 |
| CN | 109148506 A | 1/2019 |
| CN | 110034061 A | 7/2019 |

* cited by examiner

CHIP TRANSFER METHOD, DISPLAY DEVICE, CHIP AND TARGET SUBSTRATE

The present disclosure is a 371 of PCT Application No. PCT/CN2020/074709, titled "CHIP TRANSFER METHOD, DISPLAY APPARATUS, CHIP AND TARGET SUBSTRATE", filed on Feb. 11, 2020, which claims priority to Chinese Patent Application No. 201910333482.5, filed with the State Intellectual Property Office on Apr. 24, 2019 and titled "Chip Transfer Method, Display Device, Chip, and Target Substrate", which is incorporated herein by reference in its entirety.

TECHNICAL FIELD

The present disclosure relates to a chip transfer method, a display device, a chip, and a target substrate.

BACKGROUND

A micro light emitting diode (Micro LED/μLED) is a new type of LED chip. It has the advantages such as high brightness, high light emitting efficiency and low power consumption, and thus has a wide application prospect in the display industry. The Micro LED chip is usually formed on a sapphire-like substrate (hereinafter referred to as a source substrate). During use, the Micro LED chip needs to be transferred from the source substrate to a target substrate (for example a display back plate).

SUMMARY

In a first aspect, there is provided a chip transfer method, including:

disposing a target substrate in a closed cavity, the target substrate including a first alignment bonding structure and a second alignment bonding structure;

applying a charge of a first polarity to the first alignment bonding structure of the target substrate;

applying a charge of a second polarity to a first chip bonding structure of a chip, wherein the chip includes a second chip bonding structure and the first chip bonding structure, and the second polarity and the first polarity are different;

injecting an insulating fluid into the closed cavity to suspend the chip in the insulating fluid within the closed cavity, wherein under the action of the first chip bonding structure and the first alignment bonding structure, the chip moves close to the target substrate, the first chip bonding structure is caused to be in contact with the first alignment bonding structure, and the second chip bonding structure is caused to be in contact with the second alignment bonding structure; and applying a bonding force to the chip, the first chip bonding structure is caused to be bonded to the first alignment bonding structure, and the second chip bonding structure is caused to be bonded to the second alignment bonding structure.

In a second aspect, there is provided a display device, including: a chip and a target substrate, wherein the chip includes a chip main body, a first chip bonding structure and a second chip bonding structure which are located at the chip main body, the target substrate includes a base substrate, and a first alignment bonding structure and a second alignment bonding structure which are located at the base substrate, the first chip bonding structure is bonded to the first alignment bonding structure, and the second chip bonding structure is bonded to the second alignment bonding structure.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Figure 1:
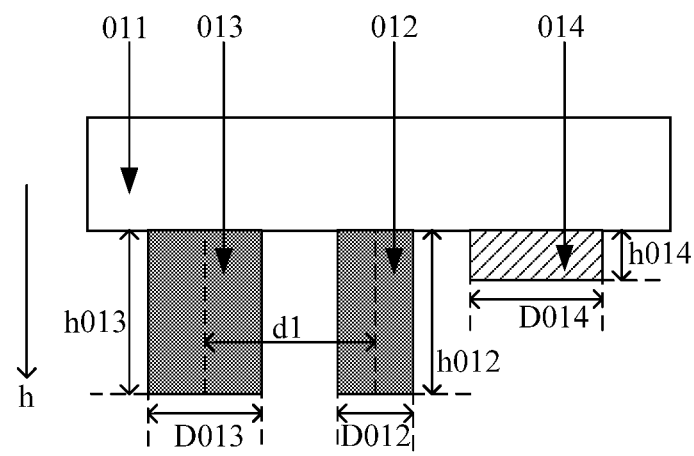
FIG. 1 is a schematic cross-sectional structural view of a chip according to an embodiment of the present disclosure.

The accompanying drawings incorporated in the description and forming a part thereof illustrate the embodiments of the present invention and are used to explain the principle of the present invention along therewith.

DETAILED DESCRIPTION

For clearer descriptions of the principles, technical solutions and advantages in the present disclosure, the present disclosure is described in detail below in combination with the accompanying drawings. It is apparent that the described embodiments are only a part of exemplary embodiments of the present disclosure, rather than all of the embodiments. According to the embodiments of the present disclosure, all of the other embodiments obtained by a person skilled in the art without consuming any creative work fall within the protection scope of the present disclosure.

A Micro LED technology is a new type of display technology that can be applied to display products such as TVs, iPhones (Apple phones) and iPads (Apple tablet computers). A Micro LED chip is a nano-level LED chip. The Micro LED chip is usually formed on a sapphire-like substrate (hereinafter referred to as a source substrate) by means of molecular beam epitaxy. The size of the sapphire-like substrate is usually the size of a silicon wafer, the size is smaller, but the size of the display product is usually larger. Therefore, when the display product is prepared, the Micro LED chip needs to be transferred from the source substrate to a target substrate. The target substrate may be a flexible substrate (also called as a bendable substrate) or a rigid substrate (for example, a glass substrate).

The core of the Micro LED technology is the transfer of the Micro LED chip instead of the preparation thereof. The transfer of a large amount of Micro LED chips has always been a technical bottleneck for industrial development. At present, the relatively commonly used technology for transferring the Micro LED chips is the micro transfer printing (μTP) technology. The μTP technology is a transfer technology that John A. Rogers, et al., of Illinois University in the United States originally used a sacrificial layer wet etching and polydimethylsiloxane (PDMS) so as to transfer the Micro LED chips to the target substrate to manufacture a Micro LED chip array. The technology was transferred (spin-out) to Semprius in 2006. In 2013, X-Celeprint obtained the technology authorization of Semprius, and began official operation in early 2014. The transfer equipment used by the μTP technology includes a print head and an elastic stamp. In simple terms, in the transfer process, the elastic stamp is used in combination with the print head to selectively pick up the Micro LED chips from the source substrate and the picked Micro LED chips are printed to the target substrate. Optionally, at first, a sacrificial layer and the Micro LED chips are manufactured on the source substrate (for example, a "source" wafer), the sacrificial layer is located between the source substrate and the Micro LED chips; then, by removing the sacrificial layer, the Micro LED chips are released, so that the Micro LED chips are separated from the source substrate; next, the print head is used together with the elastic stamp (the elastic stamp has a microstructure matching the "source" wafer) to pick up the Micro LED chips from the source substrate; and finally, the picked Micro LED chips are printed on the target substrate.

In the μTP technology, the adhesion force between the elastic stamp and the Micro LED chip can be selectively adjusted by adjusting the moving speed of the print head so as to control the transfer process of the Micro LED chip. When the elastic stamp moves faster, the adhesion force between the elastic stamp and the Micro LED chip is larger, so that the Micro LED chip is separated from the source substrate. When the elastic stamp moves slower, the adhesion force between the elastic stamp and the Micro LED chip is smaller, so that the Micro LED chip is separated from the elastic stamp and is printed to the target substrate. Multiple micro LED chips can be transferred at one time by designing the elastic stamp in a customizing manner.

However, the number of the Micro LED chips picked up by the elastic stamp each time is relatively less. Facing a million-level transfer volume of the display product, the μTP technology appears to have a lower transfer efficiency. Due to the lower transfer efficiency of the μTP technology, a higher transfer cost of the Micro LED chips is caused to a certain extent.

The embodiments of the present disclosure provide a chip transfer method, a display device, a chip, and a target substrate. An insulating fluid can be used in combination with electrostatic adsorption to achieve the alignment of the chip and the target substrate. A microfluidic technology is used for the batch transfer of the chips, and can be used for transferring the Micro LED chips. Compared with the μTP technology, the solution according to the embodiment of the present disclosure is favorable to improve the transfer efficiency of the chips, thereby reducing the transfer cost to a certain extent. The detailed solution of the present disclosure is explained below in conjunction with the accompanying drawings.

At first, the chip according to the embodiment of the present disclosure is introduced.

The embodiment of the present disclosure provides a chip. The chip may include a chip main body and a first chip bonding structure and a second chip bonding structure which are located at the chip main body. The first chip bonding structure is configured to be bonded to a first alignment bonding structure of a target substrate, and the second chip bonding structure is configured to be bonded to a second alignment bonding structure of the target substrate. The first chip bonding structure and the second chip bonding structure may be distributed in the same layer. For example, the chip may include a bonding layer on the chip main body, and the bonding layer may include a first chip bonding structure and a second chip bonding structure. In the embodiment of the present disclosure, the first chip bonding structure may be a columnar structure, and the second chip bonding structure may be a columnar structure or a ring-shaped structure. In the following, the chip according to the embodiment of the present disclosure will be described in two possible implementation manners according to the difference of the second chip bonding structure.

The first possible implementation manner: the first chip bonding structure and the second chip bonding structure are both columnar structures.

Figure 2:
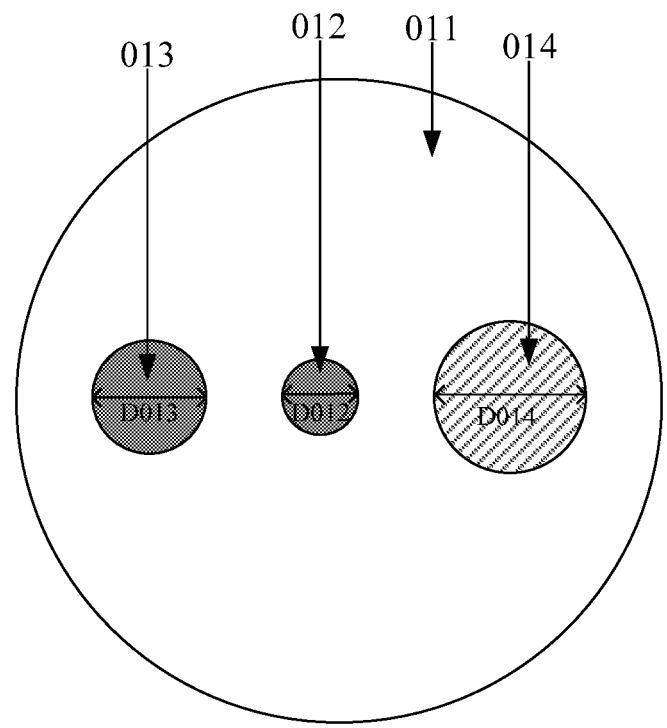
FIG. 2 is a schematic front view of the chip shown in FIG. 1.

Referring to FIG. 1, FIG. 1 shows a schematic cross-sectional structural view of a chip 01 according to an embodiment of the present disclosure. Referring to FIG. 1, the chip 01 includes a chip main body 011 and a first chip bonding structure 012 and a second chip bonding structure 013 which are located at the chip main body 011. The first chip bonding structure 012 and the second chip bonding structure 013 are distributed in the same layer, and the size of the first chip bonding structure 012 and the size of the second chip bonding structure 013 are different. Optionally, the first chip bonding structure 012 and the second chip bonding structure 013 may be both columnar structures, and a shape of a bottom surface (for example, a surface of the first chip bonding structure 012 away from the chip main body 01) of the first chip bonding structure 012 may be the same as a shape of a bottom surface (for example, a surface of the second chip bonding structure 013 away from the chip main body 01) of the second chip bonding structure 013. A size of the bottom surface of the first chip bonding structure 012 may be less than a size of the bottom surface of the second chip bonding structure 013, and a height h012 of the first chip bonding structure 012 and a height h013 of the second chip bonding structure 013 may be equal. Optionally, FIG. 2 is a schematic front view of the chip 01 shown in FIG. 1. With reference to FIG. 1 and FIG. 2, the first chip bonding structure 012 and the second chip bonding structure 013 may be both cylindrical structures. The size of the bottom surface of the first chip bonding structure 012 may refer to a diameter D012 of the first chip bonding structure 012, and the size of the bottom surface of the second chip bonding structure 013 may refer to a diameter D013 of the second chip bonding structure 013. The diameter D012 of the first chip bonding structure 012 may be less than the diameter D013 of the second chip bonding structure 013.

Optionally, as shown in FIG. 1, the chip 01 may further include: a weight body 014, which is distributed in the same layer as the second chip bonding structure 013. The first chip bonding structure 012 and the second chip bonding structure 013 may be distributed in the same layer, so the weight body 014, the first chip bonding structure 012, and the second chip bonding structure 013 may be distributed in the same layer. The weight body 014 is configured to enable a center of gravity of the chip 01 to be coincided with a center of the chip 01. Optionally, the weight body 014 may have a columnar structure, and a height h014 of the weight body 014 may be less than the height h013 of the second chip bonding structure 013. A size of a bottom surface (for example, a surface of the weight body 014 away from the chip main body 01) of the weight body 014 may be greater than the size of the bottom surface of the second chip bonding structure 013. In combination with FIG. 1 and FIG. 2, the weight body 014 may have a cylindrical structure, the size of the bottom surface of the weight body 014 may be equal to the diameter D014 of the weight body 014, and the diameter D014 of the weight body 014 may be greater than the diameter D013 of the second chip bonding structure 013. Optionally, in the embodiment of the present disclosure, the longitudinal axis cross sections of the first chip bonding structure 012, the second chip bonding structure 013, and the weight body 014 may be coplanar. The longitudinal axis cross section of any structure of the first chip bonding structure 012, the second chip bonding structure 013 and the weight body 014 may be perpendicular to the surface of the chip main body 011.

It is easy to understand that the first chip bonding structure 012, the second chip bonding structure 013, and the weight body 014 are exemplarily described in FIG. 1 and FIG. 2. The first chip bonding structure 012, the second chip bonding structure 013 and the weight body 014 may also be a prismatic structure, for example, the prismatic structure may be a hexagonal prism structure, a triangular prism structure, a quadrangular prism structure, or the like. The first chip bonding structure 012, the second chip bonding structure 013 and the weight body 014 may have the same or different structures. The weight body 014 may be a weight body of any structure, as long as the center of gravity of the chip 01 and the center of the chip 01 are coincided.

The second possible implementation manner: the first chip bonding structure is a columnar structure, and the second chip bonding structure is a ring-shaped structure.

Figure 3:
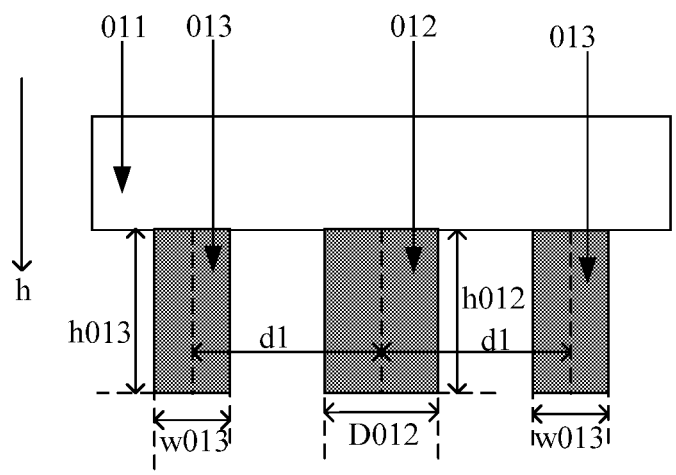
FIG. 3 is a schematic cross-sectional structural view of another chip according to an embodiment of the present disclosure.
Figure 4:
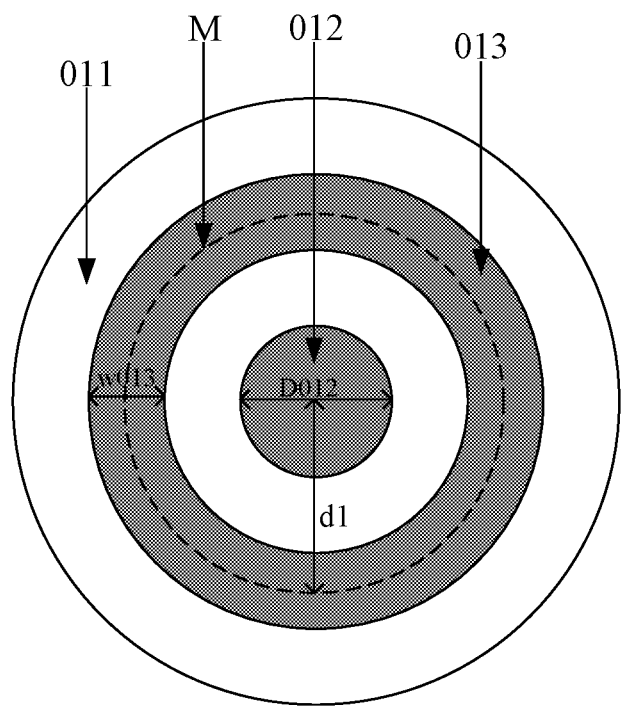
FIG. 4 is a schematic front view of the chip shown in FIG. 3.

Referring to FIG. 3, FIG. 3 shows a schematic cross-sectional structural view of another chip 01 according to an embodiment of the present disclosure. Referring to FIG. 3, the chip 01 includes a chip main body 011 and a first chip bonding structure 012 and a second chip bonding structure 013 which are located at the chip main body 011. The first chip bonding structure 012 and the second chip bonding structure 013 are distributed in the same layer. Optionally, the first chip bonding structure 012 may be a columnar structure, the second chip bonding structure 013 may be a ring-shaped structure, and the first chip bonding structure 012 may be located at a center of the ring of the second chip bonding structure 013. The height h012 of the first chip bonding structure 012 and the height h013 of the second chip bonding structure 013 may be equal. Optionally, FIG. 4 is a front schematic diagram of the chip 01 shown in FIG. 3. With reference to FIG. 3 and FIG. 4, the first chip bonding structure 012 may be a cylindrical structure, and the second chip bonding structure 013 may be a circular ring-shaped structure. The diameter D012 of the first chip bonding structure 012 may be greater than the width w013 of the second chip bonding structure 013, may also be equal to the width w013 of the second chip bonding structure 013, or may be less than the width w013 of the second chip bonding structure 013, which is not limited by the embodiment of the present disclosure.

It is easy to understand that the first chip bonding structure 012 and the second chip bonding structure 013 are exemplarily described in FIG. 3 and FIG. 4. The first chip bonding structure 012 may also be a prismatic structure, for example, the first chip bonding structure 012 may be a hexagonal prism structure, a triangular prism structure, a quadrangular prism structure or the like. The second chip bonding structure 013 may also be other ring-shaped structures, for example, the second chip bonding structure 013 may be a hexagonal ring-shaped structure, a three-sided ring-shaped structure, a four-sided ring-shaped structure or the like.

Optionally, in the embodiment of the present disclosure, the chip main body 011 may have a columnar structure, and an axis of the first chip bonding structure 012 and an axis of the chip main body 011 may be collinear. For example, as shown in FIG. 2 and FIG. 4, the chip main body 011 may have a cylindrical structure. Optionally, as shown in FIG. 1 and FIG. 3, a height direction of the first chip bonding structure 012, a height direction of the second chip bonding structure 013, and a height direction of the weight body 014 may be parallel to a height direction h of the chip 01. In the first chip bonding structure 012, the second chip bonding structure 013, and the weight body 014, the height of any structure is the size of the structure parallel to the height direction h.

Optionally, in the embodiment of the present disclosure, the chip 01 may be a light emitting chip. The chip main body 011 may include a base substrate, and a light emitting unit and a packaging layer which are located at the base substrate in sequence. The light emitting unit may include two laminated electrodes and a light emitting layer between the two electrodes. The above two chip bonding structures (the first chip bonding structure 012 and the second chip bonding structure 013) may be electrically connected to the two electrodes of the light emitting unit in a one-to-one correspondence manner. The two chip bonding structures are configured to be bonded to the substrate bonding structures of the target substrate when the chip 01 is transferred to the target substrate. For example, the above two electrodes may include an anode and a cathode, the first chip bonding structure 012 may be an anode bonding structure, the first chip bonding structure 012 may be electrically connected to an anode of the chip 01, and the first chip bonding structure 012 is configured to be bonded to the anode bonding structure of the target substrate. The second chip bonding structure 013 may be a cathode bonding structure, the second chip bonding structure 013 may be electrically connected to a cathode of the chip 01, and the second chip bonding structure 013 is configured to be bonded to the cathode bonding structure of the target substrate. In some implementation scenarios, the anode bonding structure is also called as an anode pad, and the cathode bonding structure is also called as a cathode pad. Optionally, the chip 01 may be an LED chip, for example, the chip 01 may be a Micro LED chip, and the light emitting unit may be a Micro LED.

In the embodiment of the present disclosure, the material of the first chip bonding structure 012 and the material of the second chip bonding structure 013 are both conductive materials, and the material of the first chip bonding structure 012 and the material of the second chip bonding structure 013 may be the same or different. Optionally, the material of the first chip bonding structure 012 and the material of the second chip bonding structure 013 may be both a metal material, such as metal Mo (molybdenum), metal Cu (copper), metal Al (aluminum) and its alloy materials, or the material of the first chip bonding structure 012 and the material of the second chip bonding structure 013 may be both a semiconductor oxide, such as indium tin oxide (ITO), indium zinc oxide (IZO) or aluminum-doped zinc oxide (ZnO:Al). The material of the weight body 014 may be an insulating material such as SiNx (silicon oxide), $SiO_2$ (silicon dioxide), $Al_2O_3$ (aluminum oxide), or organic resin. The first chip bonding structure 012 and the second chip bonding structure 013 may be prepared by photoetching or electroplating, and the weight body 014 may be prepared by photoetching.

Figure 5:
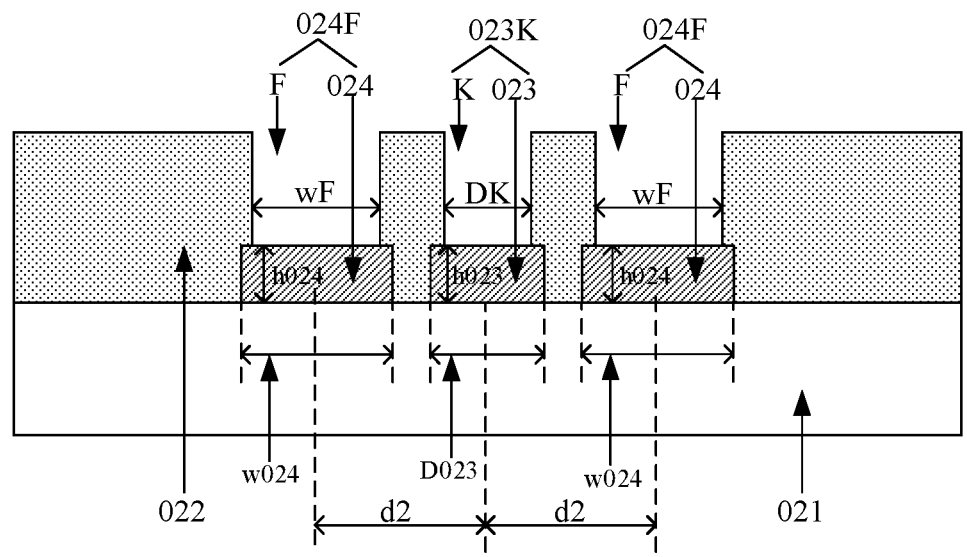
FIG. 5 is a schematic cross-sectional structural view of a target substrate according to an embodiment of the present disclosure.

The above is the chip embodiment provided by the embodiment of the present disclosure, and the target substrate according to the embodiment of the present disclosure is introduced below:

Referring to FIG. 5, FIG. 5 shows a schematic cross-sectional structural view of a target substrate 02 according to an embodiment of the present disclosure. Referring to FIG. 5, the target substrate 02 includes a base substrate 021 and a first alignment bonding structure 023K and a second alignment bonding structure 024F which are located at the base substrate 021. The first alignment bonding structure 023K is configured to be bonded to the first chip bonding structure of the chip, and the second alignment bonding structure 024F is configured to be bonded to the second chip bonding structure of the chip.

Optionally, as shown in FIG. 5, the target substrate 02 includes a bonding layer (not marked in FIG. 5) and an alignment layer 022 which are laminated on the base substrate 021, and the bonding layer includes a first substrate bonding structure 023 and a second substrate bonding structure 024. The alignment layer 022 has a first alignment opening K and a second alignment opening F, the first alignment bonding structure 023K includes the first substrate bonding structure 023 and the first alignment opening K, and the second alignment bonding structure 024F includes the second substrate bonding structure 024 and the second alignment opening F. The first alignment opening K is configured to bond the first substrate bonding structure 023 to the first chip bonding structure, and the second alignment opening F is configured to bond the second substrate bonding structure 024 to the second chip bonding structure.

Optionally, as shown in FIG. 5, the first substrate bonding structure 023 is at least partially exposed through the first alignment opening K, and the second substrate bonding structure 024 is at least partially exposed through the second alignment opening F. The size of the first alignment opening K and the size of the second alignment opening F may be different. Optionally, the size of the first chip bonding structure is less than the size of the first alignment opening K, and the size of the second chip bonding structure is less than the size of the second alignment opening F and greater than the size of the first alignment opening K. The distance between the first chip bonding structure and the second chip bonding structure is equal to the distance between the first alignment opening K and the second alignment opening F. In this way, it is convenient for the first alignment opening K to bond the first substrate bonding structure 023 to the first chip bonding structure, and the second alignment opening F enables the second substrate bonding structure 024 to be bonded to the second chip bonding structure.

Optionally, an orthogonal projection of the first substrate bonding structure 023 on the alignment layer 022 may cover the first alignment opening K, and an orthogonal projection of the second substrate bonding structure 024 on the alignment layer 022 may cover the second alignment opening F. In this way, it is convenient to expose the first substrate bonding structure 023 as much as possible through the first alignment opening K, and it is convenient to expose the second substrate bonding structure 024 as much as possible through the second alignment opening F.

Optionally, the first alignment opening K may be an alignment hole, the second alignment opening F may be an alignment slit. The size of the first chip bonding structure may be less than an aperture DK of the first alignment opening K and the size of the second chip bonding structure may be less than a width wF of the second alignment opening F and greater than the aperture DK of the first alignment opening K. In this way, it is convenient for the first chip bonding structure to enter the first alignment opening K, and it is convenient for the second chip bonding structure to enter the second alignment opening F but cannot enter the first alignment opening K, thereby ensuring that the first alignment opening K enables the first substrate bonding structure 023 to be bonded to the first chip bonding structure, and the second alignment opening F enables the second substrate bonding structure 024 to be bonded to the second chip bonding structure.

Optionally, the first substrate bonding structure 023 may be a columnar structure, the second substrate bonding structure 024 may be a ring-shaped structure, and the first substrate bonding structure 023 may be located in a center of the ring shape of the second substrate bonding structure 024. The first alignment opening K may be an alignment hole, the second alignment opening F may be a ring-shaped alignment slit, and the first alignment opening K may be located in the center of the ring shape of the second alignment opening F. The height h023 of the first substrate bonding structure 023 and the height h024 of the second substrate bonding structure 024 may be equal, the size of the first alignment opening K may be the aperture DK of the first alignment opening K, the size of the second alignment opening F may be the width wF of the second alignment opening F, and the aperture DK of the first alignment opening K may be less than the width wF of the second alignment opening F. The shape of the opening surface of the first alignment opening K may the same as a shape of a bottom surface (for example, a surface of the first substrate bonding structure 023 away from the base substrate 021) of the first substrate bonding structure 023. The aperture DK of the first alignment opening K may be less than or equal to a size of the bottom surface of the first substrate bonding structure 023, so that the orthogonal projection of the first substrate bonding structure 023 on the alignment layer 022 can cover the first alignment opening K. The shape of the opening surface of the second alignment opening F may the same as the shape of a bottom surface (for example, a surface of the second substrate bonding structure 024 away from the base substrate 021) of the second substrate bonding structure 024, and the width wF of the second alignment opening F may be less than or equal to the width of the second substrate bonding structure 024, so that the orthogonal projection of the second substrate bonding structure 024 on the alignment layer 022 may cover the second alignment opening F. The bottom surface of the ring-shaped structure may refer to the end surface of the ring-shaped structure.

Figure 6:
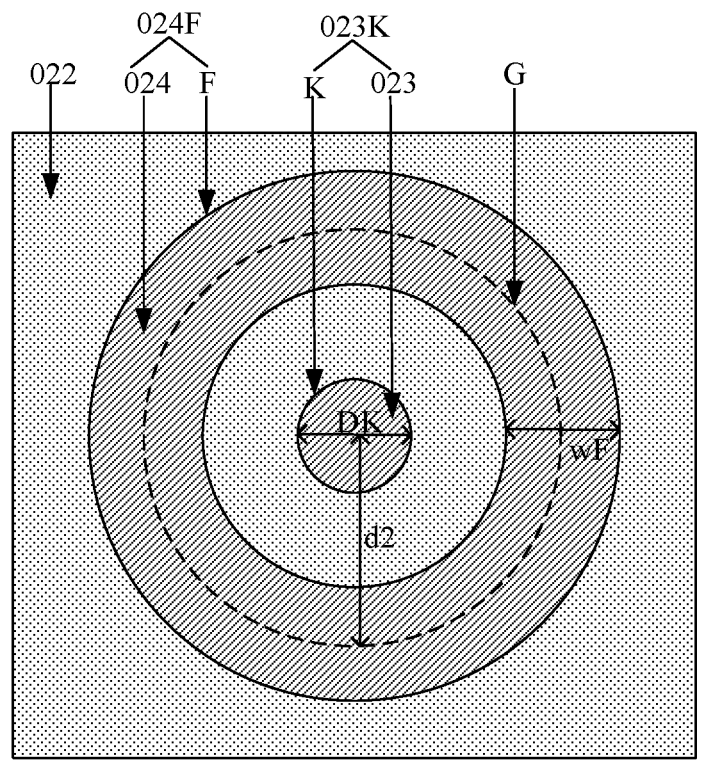
FIG. 6 is a schematic front view of the target substrate shown in FIG. 5.

Optionally, FIG. 6 is a schematic front view of the target substrate 02 shown in FIG. 5. In combination of FIG. 5 and FIG. 6, the first substrate bonding structure 023 may be a cylindrical structure, the second substrate bonding structure 024 may be a circular ring-shaped structure, the first alignment opening K may be a circular alignment hole, and the second alignment opening F may be a circular ring-shaped alignment slit. The aperture DK of the first alignment opening K may be less than or equal to the diameter D023 of the first substrate bonding structure 023, and the width wF of the second alignment opening F may be less than or equal to the width w024 of the second substrate bonding structure 024.

Optionally, in the embodiment of the present disclosure, the base substrate 021 may include two electrodes, and the two electrodes are electrically connected to the above two substrate bonding structures (the first substrate bonding structure 023 and the second substrate bonding structure 024) in a one-to-one correspondence manner. The two substrate bonding structures are configured to be bonded to the chip bonding structures when the chip is transferred to the target substrate 02. For example, the above two electrodes may include an anode and a cathode, the first substrate bonding structure 023 may be an anode bonding structure, the first substrate bonding structure 023 may be electrically connected to the anode of the base substrate 021, and the first substrate bonding structure 023 is configured to be bonded to the anode bonding structure of the chip. The second substrate bonding structure 024 may be a cathode bonding structure, the second substrate bonding structure 024 may be electrically connected to the cathode of the base substrate 021, and the second substrate bonding structure 024 is configured to be bonded to the cathode bonding structure of the chip. In some implementation scenarios, the anode bonding structure is also called as an anode pad, and the cathode bonding structure is also called as a cathode pad.

Figure 7:
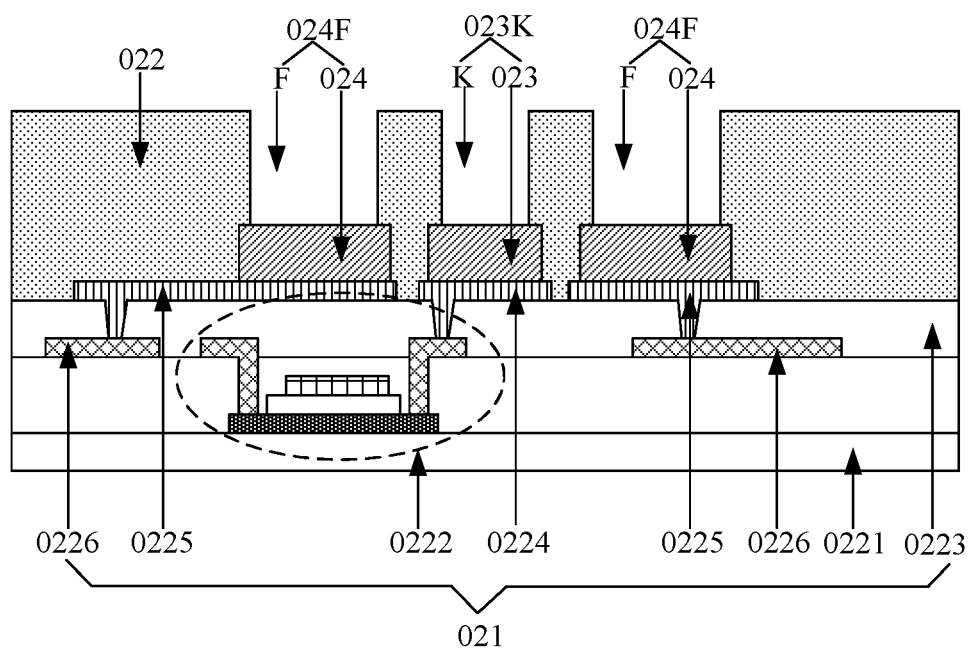
FIG. 7 is a schematic cross-sectional structural view of another target substrate according to an embodiment of the present disclosure.

In the embodiment of the present disclosure, the base substrate 021 may be a display back plate. Referring to FIG. 7, FIG. 7 shows a schematic cross-sectional structural view of another target substrate 02 according to the embodiment of the present disclosure. Referring to FIG. 7, the base substrate 021 includes a glass substrate (or other rigid substrates or flexible substrates) 0211 and a thin film transistor (TFT) 0222, a planarization layer (PLN) 0223, and an electrode layer (not shown in FIG. 7) which are located at the glass substrate in sequence. The electrode layer may include an anode 0224 and a cathode 0225. The TFT 0222 may include a gate electrode, a gate insulating layer, an active layer, an interlayer dielectric layer, a source electrode and a drain electrode. The base substrate 021 also includes data lines and cathode lines 0226. The data lines, the cathode lines 0226, the source electrode and the drain electrode may be distributed in the same layer. The data lines may be electrically connected to the source electrode. The planarization layer 0223 may have an anode via hole and a cathode via hole. The anode 0224 may be electrically connected to the drain electrode through the anode via hole. The cathode 0225 may be electrically connected to the cathode lines 0226 through the cathode via hole. The bonding layer may be located at one side of the electrode layer away from the planarization layer 0223, the first substrate bonding structure 023 may be electrically connected to the anode 0224, and the second substrate bonding structure 024 may be electrically connected to the cathode 0225.

In the embodiment of the present disclosure, the material of the first substrate bonding structure 023 and the material of the second substrate bonding structure 024 are both a conductive material, and the material of the first substrate bonding structure 023 and the material of the second substrate bonding structure 024 may be the same or different. Optionally, the material of the first substrate bonding structure 023 and the material of the second substrate bonding structure 024 may be both a metal material, such as metal Mo, metal Cu, metal Al, and alloy materials thereof, or, the material of the first substrate bonding structure 023 and the material of the second substrate bonding structure 024 may be a semiconductor oxide, such as ITO, IZO and ZnO:Al.

The material of the alignment layer 022 may be an organic insulating material, for example organic resin, etc. The first substrate bonding structure 023 and the second substrate bonding structure 024 may be prepared by photoetching or electroplating, and the alignment layer 022 may be prepared by photoetching, which is not repeated by the embodiment of the present disclosure.

The above is the target substrate embodiment provided by the embodiment of the present disclosure. The following describes a chip transfer method according to the embodiment of the present disclosure: the chip transfer method according to the embodiment of the present disclosure may be configured to transfer the chip from the source substrate to the target substrate. The chip may be the chip 01 shown in FIG. 1 to FIG. 4, and the target substrate may be the target substrate 02 shown in FIG. 5 to FIG. 7.

Figure 8:
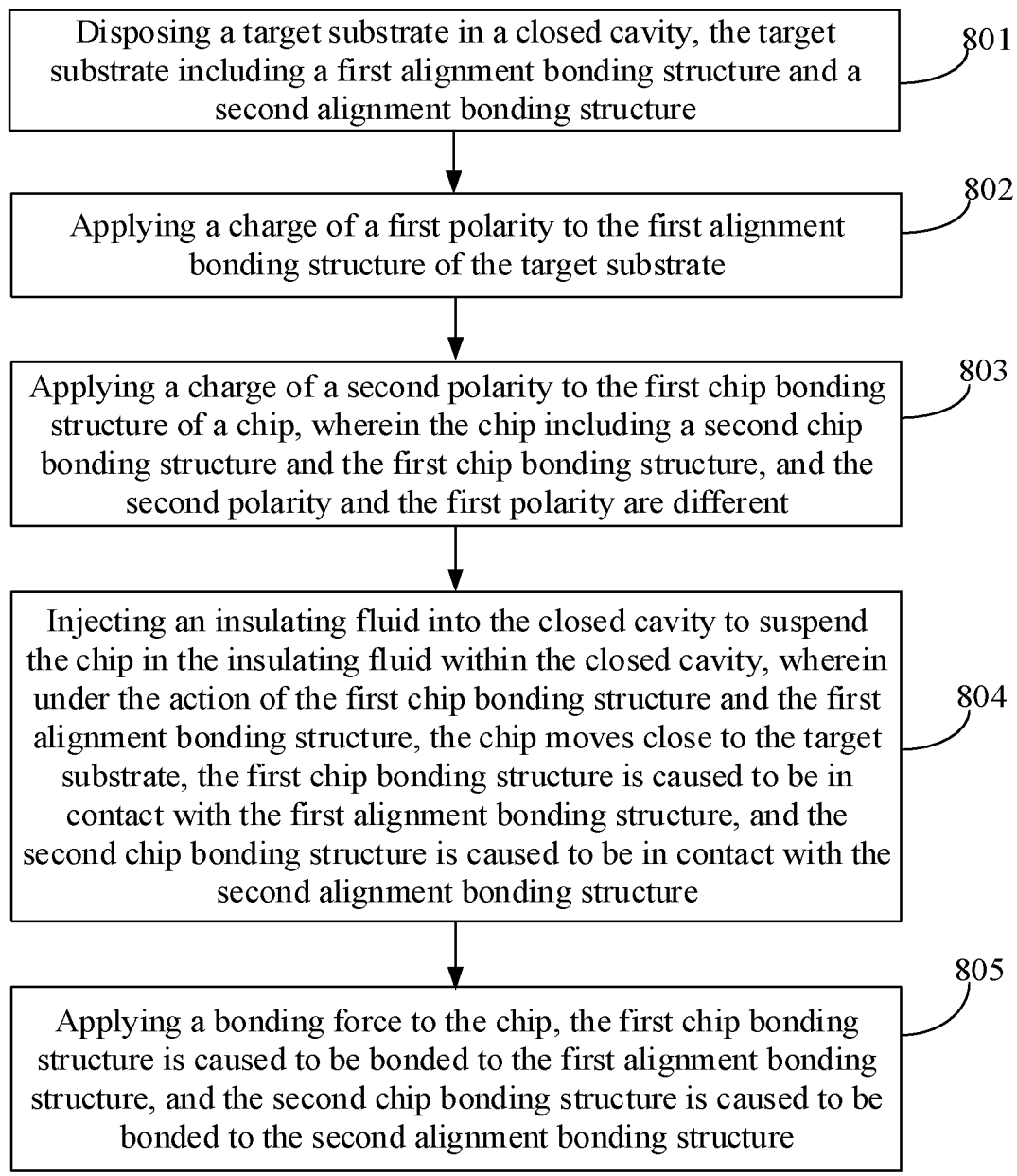
FIG. 8 is a method flowchart of a chip transfer method according to an embodiment of the present disclosure.

Referring to FIG. 8, FIG. 8 shows a method flowchart of a chip transfer method according to the embodiment of the present disclosure. Referring to FIG. 8, the method includes the following steps.

In step 801, a target substrate is disposed in a closed cavity, and the target substrate includes a first alignment bonding structure and a second alignment bonding structure.

Optionally, a support frame may be disposed in the closed cavity, and the target substrate may be placed on the support frame, thereby disposing the target substrate in the closed cavity. In the embodiment of the present disclosure, the target substrate may include a first alignment bonding structure and a second alignment bonding structure. For example, as shown in FIG. 5 to FIG. 7, the target substrate 02 includes a first alignment bonding structure 023K and a second alignment bonding structure 024F.

In step 802, a charge of a first polarity is applied to the first alignment bonding structure of the target substrate.

Optionally, the first alignment bonding structure may include a first substrate bonding structure and a first alignment opening. A charge of a first polarity may be applied to the first substrate bonding structure, thereby applying the charge of the first polarity to the first alignment bonding structure. Optionally, the target substrate has a line electrically connected to the first substrate bonding structure, and the charge of the first polarity may be applied to the first substrate bonding structure through the line. Exemplarily, as shown in FIG. 7, the first alignment bonding structure 023K includes the first substrate bonding structure 023 and the first alignment opening K. The data line (not shown in FIG. 7) may be electrically connected to the first substrate bonding structure 023 through the TFT 0222 and the anode 0224, and the charge of the first polarity may be applied to the first substrate bonding structure 023 through the data line, thereby applying the charge of the first polarity charge to the first alignment bonding structure 023K.

Optionally, when the charge of the first polarity is applied to the first alignment bonding structure, the charge of the first polarity may also be applied to the second alignment bonding structure, or the second alignment bonding structure is grounded. The second alignment bonding structure may include a second substrate bonding structure and a second alignment opening. The charge of the first polarity may be applied to the second substrate bonding structure or the second substrate bonding structure may be grounded. Thus, the charge of the first polarity is applied to the second alignment bonding structure or the second alignment bonding structure is grounded. Optionally, the target substrate has a line electrically connected to the second substrate bonding structure, and the charge of the first polarity may be applied to the second substrate bonding structure through the line or the second substrate bonding structure may be grounded. Exemplarily, as shown in FIG. 7, the second alignment bonding structure 024F includes a second substrate bonding structure 024 and a second alignment opening F, and a cathode line 0226 is electrically connected to the second substrate bonding structure 024. By the cathode line 0226, the charge of the first polarity is applied to the second substrate bonding structure 024 or the second substrate bonding structure 024 is grounded, thereby applying the charge of the first polarity to the second alignment bonding structure 024F or grounding the second alignment bonding structure 024F.

In step 803, a charge of a second polarity is applied to a first chip bonding structure of the chip, the chip includes a second chip bonding structure and the first chip bonding structure, and the second polarity and the first polarity are different.

Optionally, the charge of the second polarity may be applied to the first chip bonding structure by means of triboelectrification, and the second polarity is different from the first polarity. Exemplarily, the first polarity is positive and the second polarity is negative. In the embodiment of the present disclosure, the chip may include a first chip bonding structure and a second chip bonding structure. For example, as shown in FIG. 1 to FIG. 4, the chip 01 may include the first alignment bonding structure 012 and the second alignment bonding structure 013.

Optionally, while the charge of the second polarity is applied to the first chip bonding structure, the charge of the second polarity may also be applied to the second chip bonding structure, or may not be applied to the second chip bonding structure, which is not limited in the embodiment of the present disclosure.

In step 804, an insulating fluid is injected into the closed cavity to suspend the chip in the insulating fluid within the closed cavity. Under the action of the first chip bonding structure and the first alignment bonding structure, the chip moves close to the target substrate, the first chip bonding structure is caused to be in contact with the first alignment bonding structure, and the second chip bonding structure is caused to be in contact with the second alignment bonding structure.

Optionally, the closed cavity may have a fluid inlet, and the insulating fluid may be injected into the closed cavity through the fluid inlet to suspend the chip in the insulating fluid in the closed cavity. Since the first alignment bonding structure and the first chip bonding structure carry charges of different polarities, there is an attractive force between the first chip bonding structure and the first alignment bonding structure. Under the action of the attractive force and the suspension force of the insulating fluid, the first chip bonding structure moves close to the first alignment bonding structure and drives the chip to move close to the target substrate, the first chip bonding structure is caused to be in contact with the first alignment bonding structure, and the second chip bonding structure is caused to be in contact with the second alignment bonding structure. At this point, the alignment of the chip and the target substrate can be completed.

Optionally, the first alignment bonding structure may include a first substrate bonding structure and a first alignment opening, and the second alignment bonding structure may include a second substrate bonding structure and a second alignment opening. The applying of the charge of the first polarity to the first alignment bonding structure may be the applying of the charge of the first polarity to the first substrate bonding structure. Therefore, the first substrate bonding structure and the first chip bonding structure may carry the charges of different polarities. There is an attractive force between the first chip bonding structure and the first substrate bonding structure. Under the action of the attractive force and the suspension force of the insulating fluid, the chip moves close to the target substrate, so that the first chip bonding structure enters the first alignment opening to be in contact with the first substrate bonding structure, and the second chip bonding structure enters the second alignment opening to be in contact with the second substrate bonding structure.

In the embodiment of the present disclosure, the size of the first chip bonding structure may be less than the size of the first alignment opening, and the size of the second chip bonding structure may be less than the size of the second alignment opening and greater than the aperture of the first alignment opening. The distance between the first chip bonding structure and the second chip bonding structure may be equal to the distance between the first alignment opening and the second alignment opening, so that the first chip bonding structure can enter the first alignment opening, and the second chip bonding structure can enter the second alignment opening but cannot enter the first alignment opening. While the first chip bonding structure is entering the first alignment opening, the second chip bonding structure can enter the second alignment opening. Finally, the first chip bonding structure can be in contact with the first substrate bonding structure through the first alignment opening, and the second chip bonding structure can be in contact with the second substrate bonding structure through the second alignment opening.

Exemplarily, referring to FIG. 1 to FIG. 6, the size of the first chip bonding structure 012 may be less than the size of the first alignment opening K, and the size of the second chip bonding structure 013 may be less than the size of the second alignment opening F and greater than the size of the first alignment opening K. A distance d1 between the first chip bonding structure 012 and the second chip bonding structure 013 may be equal to a distance d2 between the first alignment opening K and the second alignment opening F. Therefore, the first chip bonding structure 012 can enter the first alignment opening K, the second chip bonding structure 013 can enter the second alignment opening F but cannot enter the first alignment opening K. While the first chip bonding structure 012 enters the first alignment opening K, the second chip bonding structure 013 can enter the second alignment opening F.

Optionally, as shown in FIG. 1 and FIG. 2, when the first chip bonding structure 012 and the second chip bonding structure 013 are both cylindrical structures, the distance d1 between the first chip bonding structure 012 and the second chip bonding structure 013 may be a distance between the axis of the first chip bonding structure 012 and the axis of the second chip bonding structure 013. As shown in FIG. 3 and FIG. 4, when the first chip bonding structure 012 is the cylindrical structure and the second chip bonding structure 013 is the circular ring-shaped structure, the distance d1 between the first chip bonding structure 012 and the second chip bonding structure 013 may be the distance between the axis of the first chip bonding structure 012 and a median plane M of the second chip bonding structure 013. A distance between any point on the median plane M and an inner ring of the second chip bonding structure 013 is equal to a distance between the point and an outer ring of the second chip bonding structure 013. As shown in FIG. 5 and FIG. 6, the distance d2 between the first alignment opening K and the second alignment opening F may be a distance between the axis of the first alignment opening K and a median plane G of the second alignment opening F. The distances between any point on the median plane G and two sides of the second alignment opening F are equal.

Optionally, the closed cavity may also have a fluid outlet, and while the insulating fluid is being injected into the closed cavity through the fluid inlet, the insulating fluid may be drawn from the closed cavity through the fluid outlet. In this way, the flowing direction of the insulating fluid in the closed cavity can be controlled.

Optionally, in the embodiment of the present disclosure, injecting an insulating fluid into the closed cavity to suspend the chip in the insulating fluid within the closed cavity may include: disposing the chip in the closed cavity at first, and then inject the insulating fluid into the closed cavity. Under the action of the insulating fluid, the chip is suspended in the insulating fluid within the closed cavity. Or, mixing the chip with the insulating fluid at first, then injecting the insulating fluid mixed with the chip into the closed cavity to suspend the chip in the insulating fluid within the closed cavity. It is easy to understand that the chip may also be suspended in the insulating fluid within the closed cavity in other ways, which is not limited in the embodiment of the present disclosure.

Optionally, in the embodiment of the present disclosure, the chip may be grown on the source substrate. Before the chip is disposed in the closed cavity, the chip may be separated from the source substrate. Exemplarily, the source substrate may have a sacrificial layer thereon, the chip may be grown on the sacrificial layer, and the chip may be separated from the source substrate by etching the sacrificial layer.

In step 805, a bonding force is applied to the chip to bond the first chip bonding structure to the first alignment bonding structure, and to bond the second chip bonding structure to the second alignment bonding structure.

After the first chip bonding structure is in contact with the first alignment bonding structure, and the second chip bonding structure is in contact with the second alignment bonding structure (that is, after the chip is aligned with the target substrate), the bonding force may be applied to the chip to bond the first chip bonding structure to the first alignment bonding structure, and to bond the second chip bonding structure to the second alignment bonding structure. So far, the chip transfer is completed. As mentioned above, it is easy to understand that the first chip bonding structure being in contact with the first alignment bonding structure may be that the first chip bonding structure is in contact with the first substrate bonding structure through the first alignment opening, and the second chip bonding structure being in contact with the second alignment bonding structure may be that the second chip bonding structure is in contact with the second substrate bonding structure through the second alignment opening. Therefore, by applying the bonding force to the chip, the first chip bonding structure is bonded to the first substrate bonding structure, and the second chip bonding structure is bonded to the second substrate bonding structure.

Optionally, a pressing substrate opposite to the target substrate may be disposed in the closed cavity, and pressure may be applied to the chip by the pressing substrate, so that the first chip bonding structure is bonded to the first substrate bonding structure, and the second chip bonding structure is bonded to the second substrate bonding structure.

In summary, according to the chip transfer method in the present disclosure, the target substrate is disposed in the closed cavity; the charge of the first polarity is applied to the first alignment bonding structure of the target substrate; the charge of the second polarity is applied to the first chip bonding structure of the chip, and the second polarity is different from the first polarity; and the insulating fluid is injected into the closed cavity to suspend the chip in the insulating fluid within the closed cavity. Under the action of the first alignment bonding structure and the first alignment bonding structure, the chip moves close to the target substrate, the first chip bonding structure is in contact with the first alignment bonding structure, and the second chip bonding structure is in contact with the second alignment bonding structure. By applying the bonding force to the chip, the first chip bonding structure is bonded to the first alignment bonding structure, and the second chip bonding structure is bonded to the second alignment bonding structure. Since the alignment of the chip and the target substrate can be achieved by using the insulating fluid in combination with an electrostatic adsorption force, it is favorable to realize the batch transfer of the chips and to improve the transfer efficiency of the chips.

In the solution provided by the embodiment of the present disclosure, in the insulating fluid, based on the electrostatic adsorption force between the target substrate and the chip and the suspension force of the insulating fluid, the alignment of the chip and the target substrate is achieved, which is favorable to achieve the high-efficiency, low-cost and high-precision alignment of the target substrate and the chip. The solution can be used for the transfer of a large amount of chips, and the transfer cost of the chip is reduced.

The following is divided into two embodiments in combination with FIG. 1 to FIG. 6. That the chip 01 as shown in FIG. 1 is transferred to the target substrate 02 as shown in FIG. 5, and the chip 01 as shown in FIG. 3 is transferred to the target substrate 02 shown in FIG. 5 are used as an example to describe the chip transfer process according to the embodiment of the present disclosure.

FIG. 9 to FIG. 13 are schematic diagrams of a chip transfer method according to the embodiment of the present disclosure. FIG. 9 to FIG. 13 take that the chip 01 as shown in FIG. 1 is transferred to the target substrate 02 as shown in FIG. 5 as an example for illustration.

Figure 9:
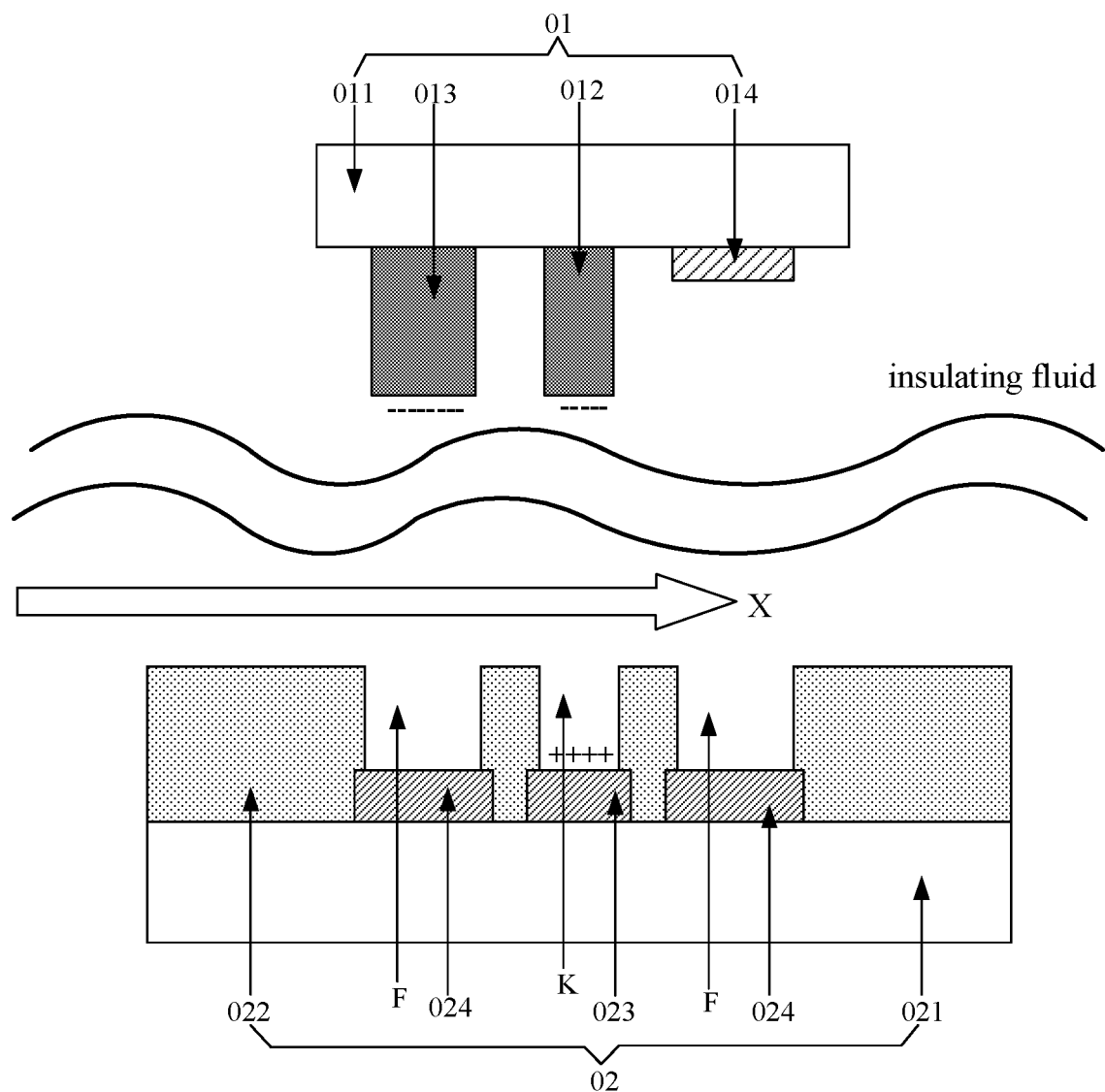
FIG. 9 to FIG. 13 are schematic diagrams of a chip transfer process according to an embodiment of the present disclosure.

Referring to FIG. 9, the target substrate 02 is disposed in the closed cavity (not shown in FIG. 9 to FIG. 13), a positive charge is applied to the first substrate bonding structure 023, and the second substrate bonding structure 024 is grounded. A negative charge is applied to the first chip bonding structure 012 and the second chip bonding structure 013, and the chip 01 is disposed in the closed cavity. Then the insulating fluid flowing in the direction X is injected into the closed cavity, and the chip 01 is suspended in the insulating fluid. Since the first substrate bonding structure 023 and the first chip bonding structure 012 carry opposite charges, there is an attractive force between the first substrate bonding structure 023 and the first chip bonding structure 012. Due to the attractive force between the first chip bonding structure 012 and the first substrate bonding structure 023 and the suspension force of the insulating fluid for the chip 01, the chip 01 moves close to the target substrate 02.

Figure 10:
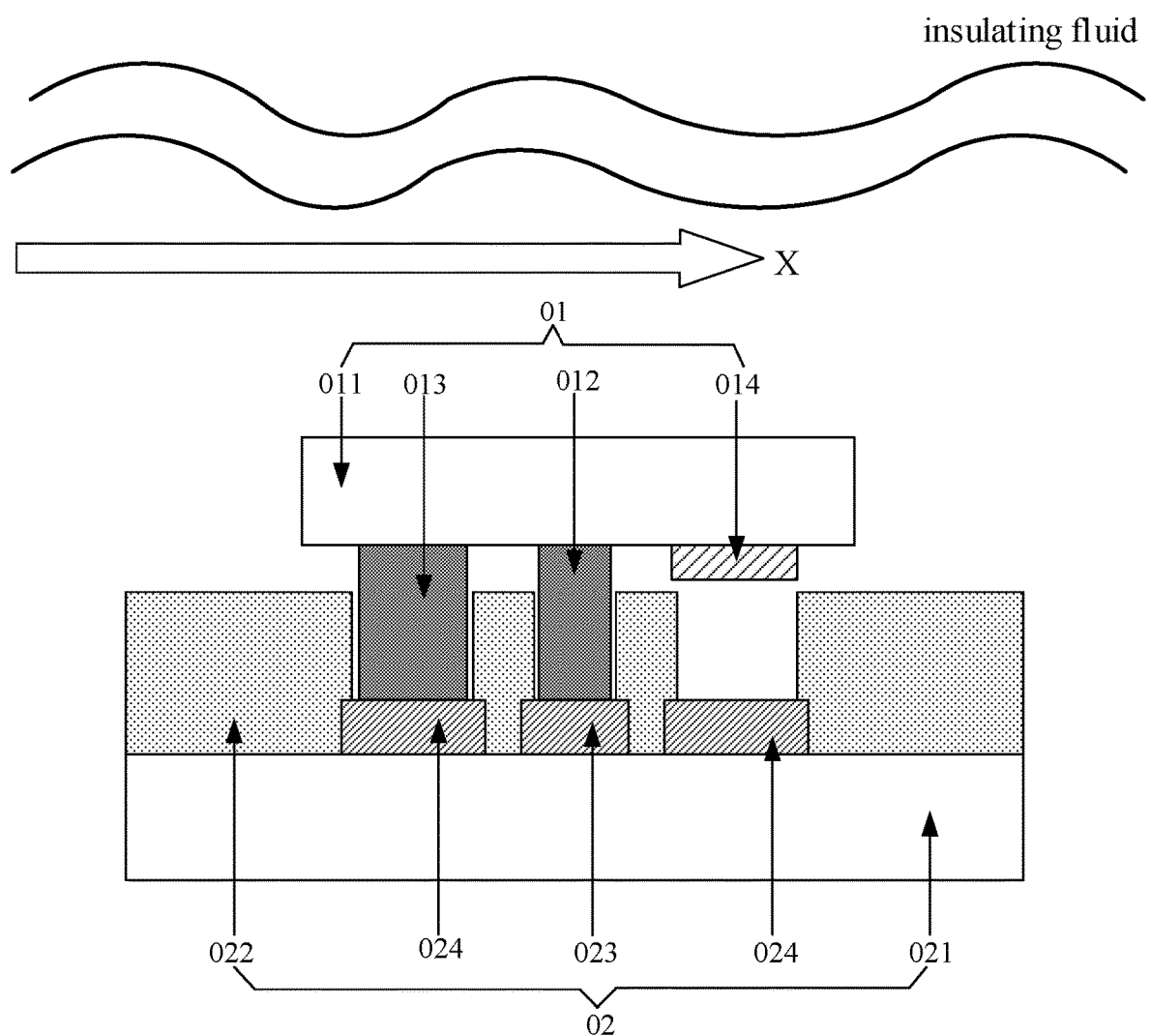
Figure 11:
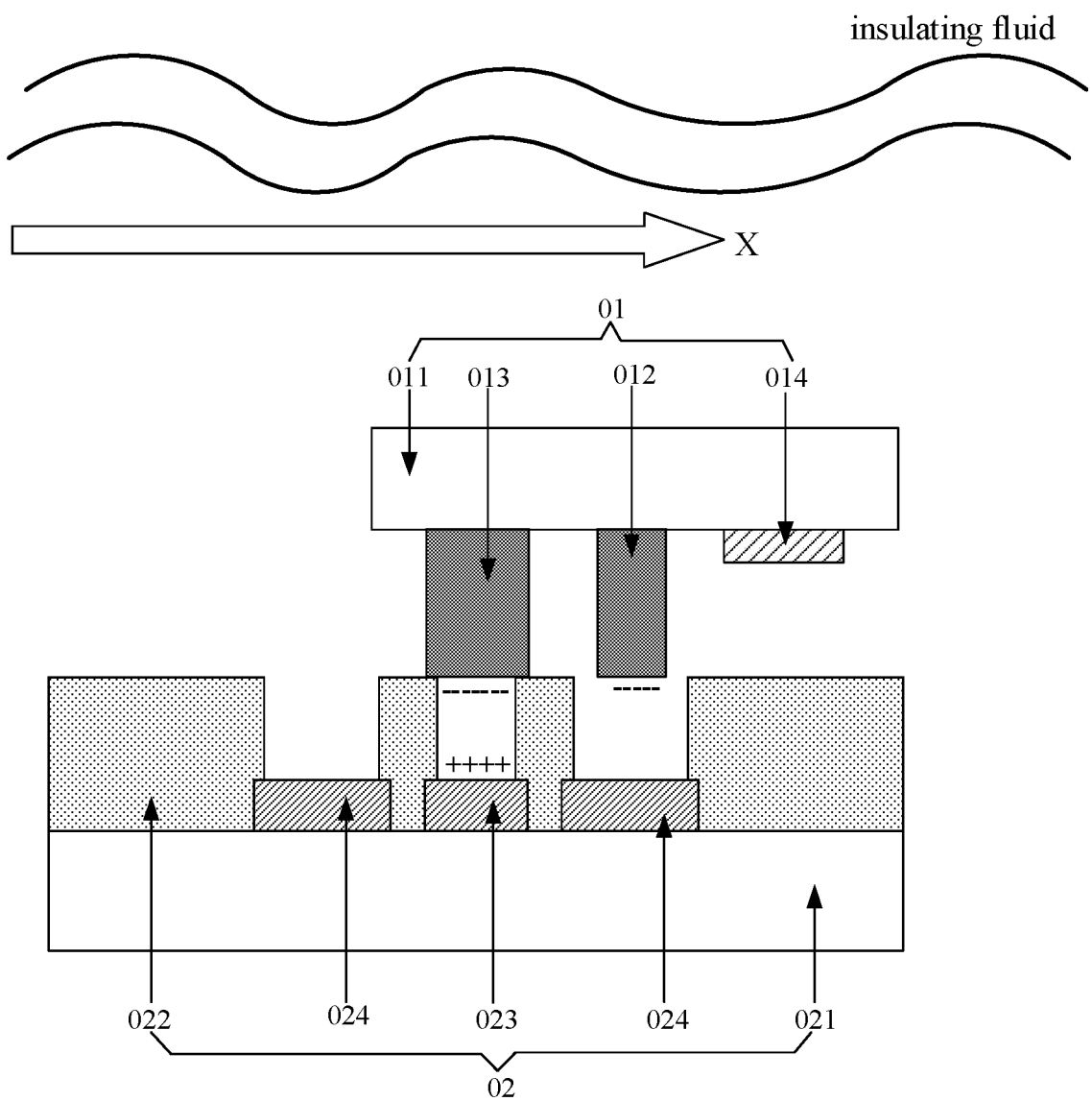

Referring to FIG. 10 and FIG. 11, and in combination with FIG. 1, FIG. 2, FIG. 5, and FIG. 6, that the first alignment opening K is an alignment hole and the second alignment opening F is an alignment slit is taken as an example. Since the size of the first chip bonding structure 012 is less than the aperture DK of the first alignment opening K, and the size of the second chip bonding structure 013 is greater than the aperture DK of the first alignment opening K, the first chip bonding structure 012 can enter the first alignment opening K (as shown in FIG. 10), but the second chip bonding structure 013 cannot enter the first alignment opening K (as shown in FIG. 11). The size of the second chip bonding structure 013 is less than the width wF of the second alignment opening F, and the distance d1 between the first chip bonding structure 012 and the second chip bonding structure 013 is equal to the distance d2 between the first alignment opening K and the second alignment opening F. Therefore, as shown in FIG. 10, while the first chip bonding structure 012 is entering the first alignment opening K, the second chip bonding structure 013 enters the second alignment opening F, the first chip bonding structure 012 is in contact with the first substrate bonding structure 023 through the first alignment opening K, and the second chip bonding structure 013 is in contact with the second substrate bonding structure 024 through the second alignment opening F. So far, the alignment of the chip 01 and the target substrate 02 is completed.

Figure 12:
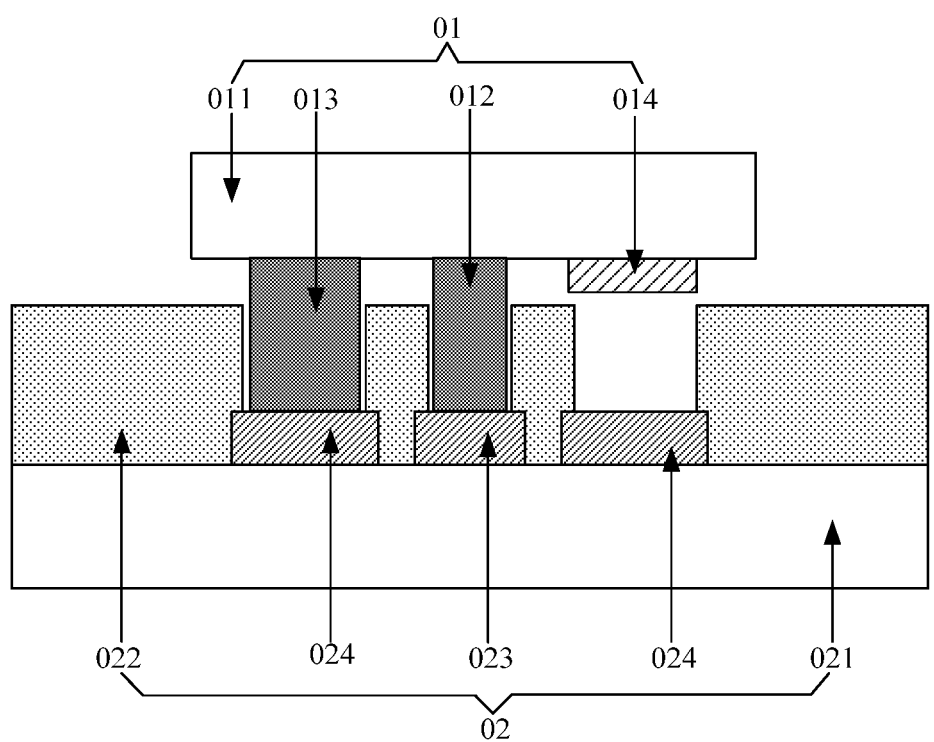
Figure 13:
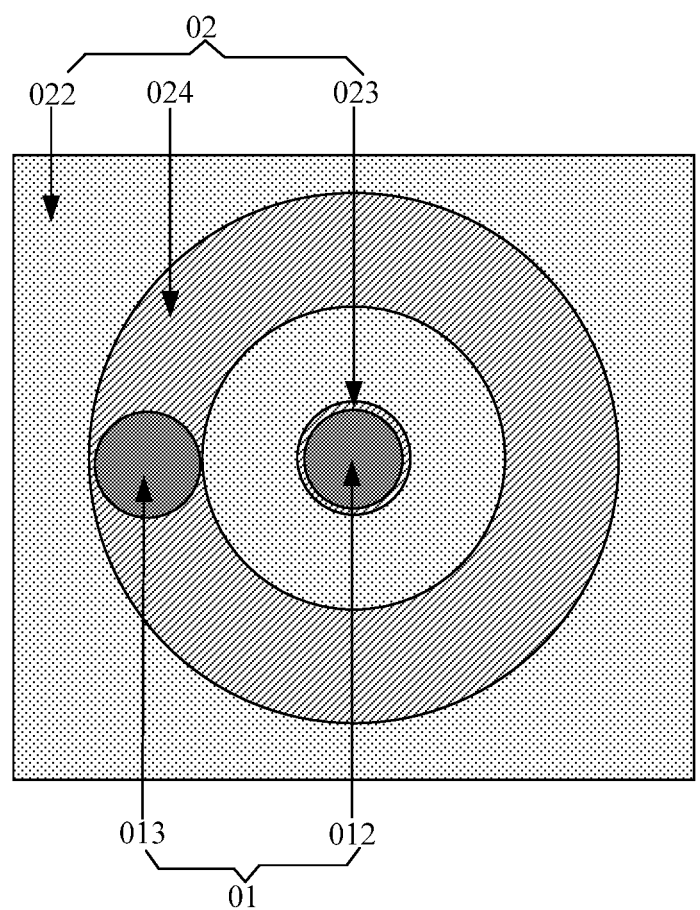

Finally, the bonding force is applied to the chip 01 to bond the first chip bonding structure 012 to the first substrate bonding structure 023, and to bond the second chip bonding structure 013 to the second substrate bonding structure 024 (as shown in FIG. 12). At this point, the chip transfer is completed. After the chip 01 as shown in FIG. 1 is transferred to the target substrate 02 as shown in FIG. 5, the cross-sectional view may be as shown in FIG. 12, and the front view may be as shown in FIG. 13. It is easy to understand that in order to clearly show the relationship between the first chip bonding structure 012 and the first substrate bonding structure 023, and the relationship between the second chip bonding structure 013 and the second substrate bonding structure 024, the weight body 014 and the chip main body 011 are not shown in FIG. 13.

In the embodiment of the present disclosure, since the size of the second chip bonding structure 013 is greater than the aperture DK of the first alignment opening K, during the alignment of the chip 01 and the target substrate 02, the second chip bonding structure 013 cannot enter the first alignment opening K, and a condition as shown in FIG. 11 will occur. For the condition as shown in FIG. 11, the chip 01 will continue to flow along with the insulating fluid until the first chip bonding structure 012 enters the first alignment opening K.

FIG. 14 to FIG. 17 are schematic diagrams of another chip transfer method according to the embodiment of the present disclosure, and FIG. 14 to FIG. 17 take that the chip 01 as shown in FIG. 3 is transferred to the target substrate as shown in FIG. 5 as an example for illustration.

Figure 14:
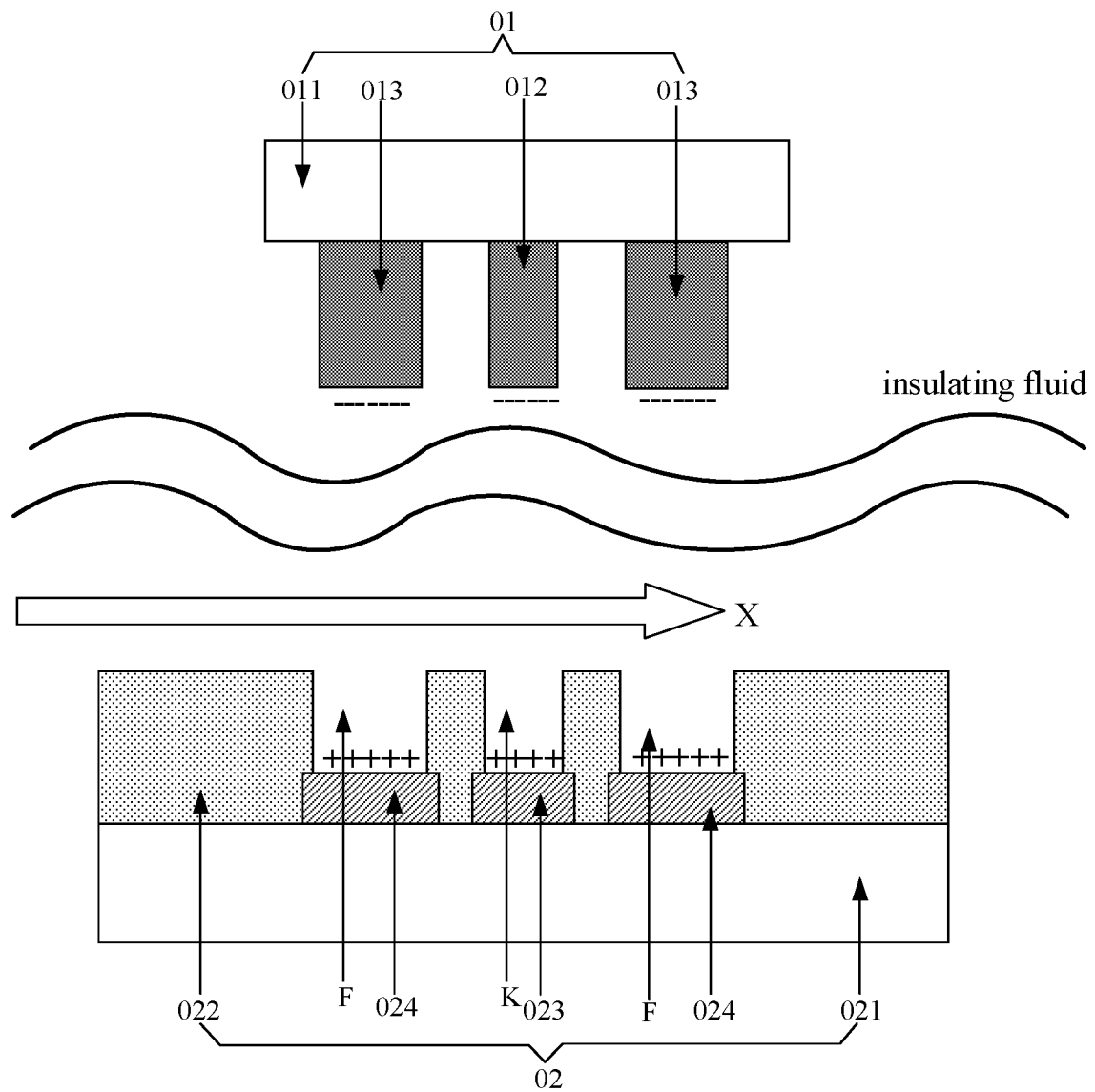
FIG. 14 to FIG. 17 are schematic diagrams of another chip transfer process according to an embodiment of the present disclosure.

Referring to FIG. 14, the target substrate 02 is disposed in the closed cavity (not shown in FIG. 14 to FIG. 17), and a positive charge is applied to the first substrate bonding structure 023 and the second substrate bonding structure 024. A negative charge is applied to the first chip bonding structure 012 and the second chip bonding structure 013. The chip 01 is disposed in the closed cavity, then the insulating fluid flowing in the direction X is injected into the closed cavity, and the chip 01 is suspended in the insulating fluid. Since the first substrate bonding structure 023 and the first chip bonding structure 012 carry opposite charges, there is an attractive force between the first substrate bonding structure 023 and the first chip bonding structure 012. Due to the attractive force between the first substrate bonding structure 023 and the first chip bonding structure 012 and the suspension force of the insulating fluid for the chip 01, the chip 01 moves close to the target substrate 02.

Figure 15:
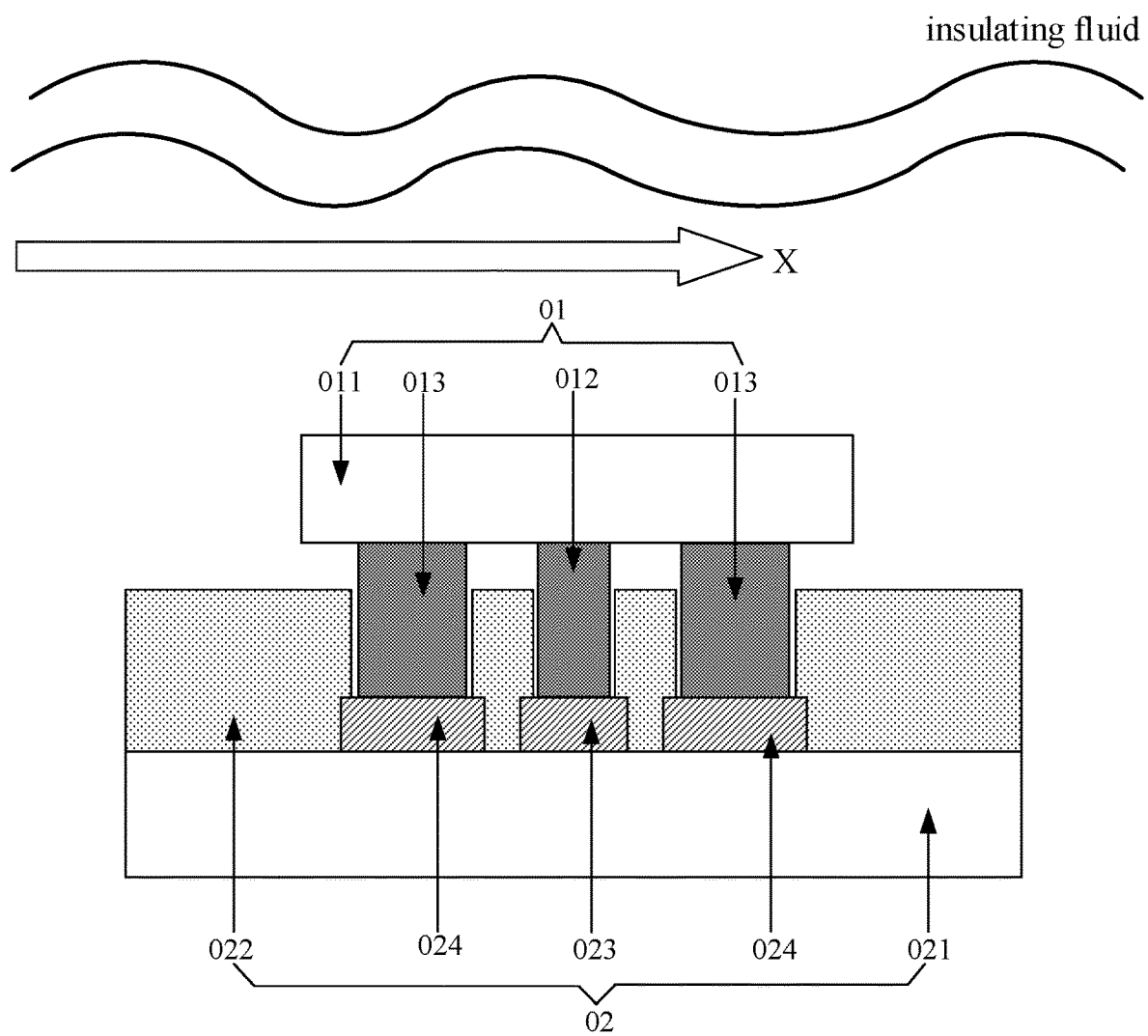
Figure 16:
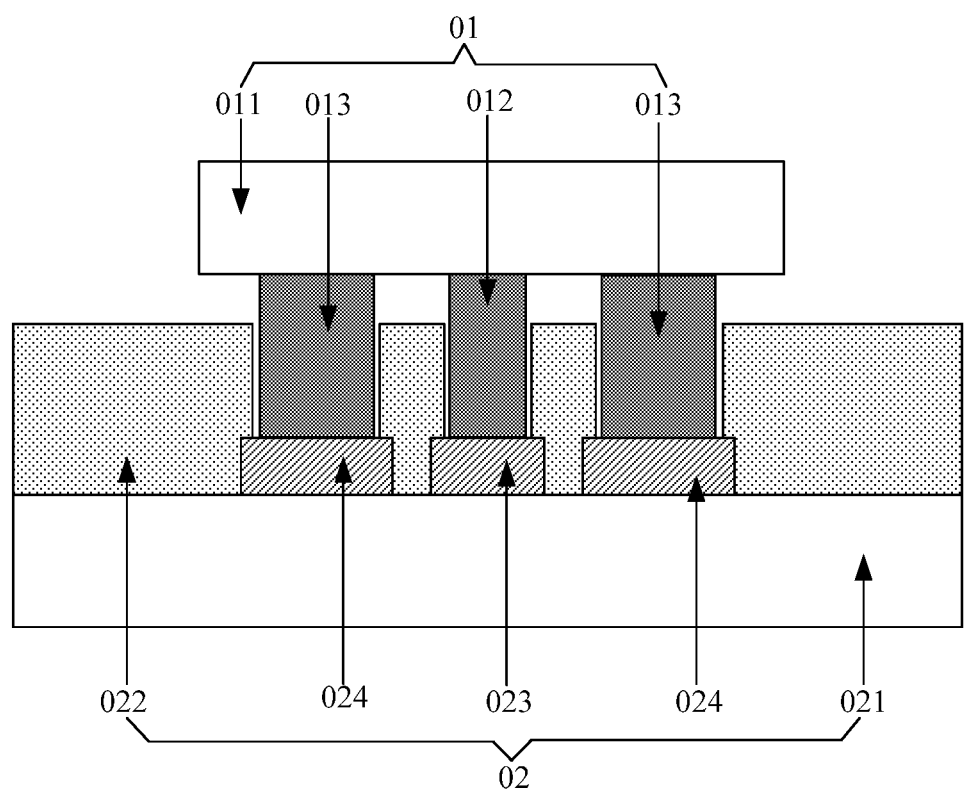

Referring to FIG. 15 and in combination with FIG. 4 to FIG. 6, that the first alignment opening K is an alignment hole and the second alignment opening F is an alignment slit is taken as an example. The size of the first chip bonding structure 012 is less than the aperture DK of the first alignment opening K, and the second chip bonding structure 013 is a ring-shaped structure centered on the first chip bonding structure 012. Therefore, the first chip bonding structure 012 can enter the first alignment opening K (as shown in FIG. 16), but the second chip bonding structure 013 cannot enter the first alignment opening K. The size of the second chip bonding structure 013 is less than the width wF of the second alignment opening F, and the distance d1 between the first chip bonding structure 012 and the second chip bonding structure 013 is equal to the distance d2 between the first alignment opening K and the second alignment opening F. Therefore, as shown in FIG. 16, while the first chip bonding structure 012 is entering the first alignment opening K, the second chip bonding structure 013 enters the second alignment opening F, the first chip bonding structure 012 is in contact with the first substrate bonding structure 023 through the first alignment opening K, and the second chip bonding structure 013 is in contact with the second substrate bonding structure 024 through the second alignment opening F. At this point, the alignment of the chip 01 and the target substrate 02 is completed.

Figure 17:
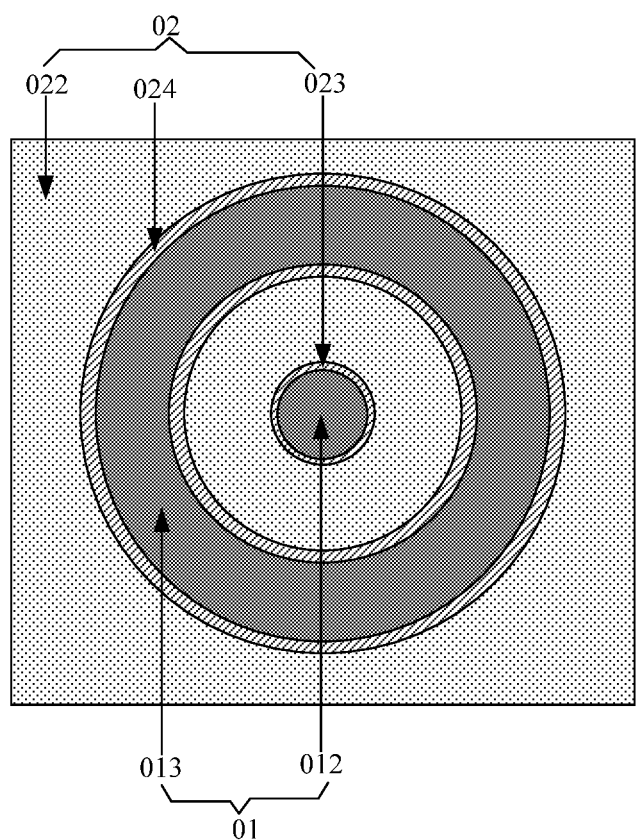

Finally, the bonding force is applied to the chip 01, so that the first chip bonding structure 012 is bonded to the first substrate bonding structure 023, and the second chip bonding structure 013 is bonded to the second substrate bonding structure 024. At this point, the chip transfer is completed. After the chip 01 as shown in FIG. 3 is transferred to the target substrate 02 as shown in FIG. 5, the cross-sectional view may be as shown in FIG. 16, and the front view may be as shown in FIG. 17. It is easy to understand that in order to clearly show the relationship between the first chip bonding structure 012 and the first substrate bonding structure 023, and the relationship between the second chip bonding structure 013 and the second substrate bonding structure 024, the chip main body 011 is not shown in FIG. 17.

Based on the same inventive concept, the embodiment of the present disclosure also provides a display device including the target substrate and the chip according to the above embodiments. The chip is transferred from a source substrate to the target substrate by using the chip transfer method in the above embodiment. The display device may be as shown in FIG. 12 and FIG. 13, or the display device may be as shown in FIG. 16 and FIG. 17.

The display device may be any product or component with a display function such as electronic paper, a mobile phone, a tablet computer, a television, a display, a notebook computer, a digital photo frame, a navigator, or a wearable device.

Optionally, referring to 12, FIG. 13, FIG. 16, and FIG. 17, the display device includes a chip 01 and a target substrate 02. With reference to FIG. 1 to FIG. 4, the chip 01 includes a first chip bonding structure 012 and a second chip bonding structure 013. With reference to FIG. 5 to FIG. 7, the target substrate 02 includes a first alignment bonding structure 023K and a second alignment bonding structure 024F. The first chip bonding structure 012 is bonded to the first alignment bonding structure 023K, and the second chip bonding structure 013 is bonded to the second alignment bonding structure 024F.

Optionally, referring to FIG. 12, FIG. 13, FIG. 16, and FIG. 17 and in combination with FIG. 5 to FIG. 7, the target substrate 02 includes a bonding layer and an alignment layer 022 which are laminated. The bonding layer includes a first substrate bonding structure 023 and a second substrate bonding structure 024. The alignment layer 022 has a first alignment opening K and a second alignment opening F. The first alignment bonding structure 023K includes the first substrate bonding structure 023 and the first alignment opening K. The second alignment bonding structure 024F includes the second substrate bonding structure 024 and the second alignment opening F. The first chip bonding structure 012 is bonded to the first substrate bonding structure 023 through the first alignment opening K, and the second chip bonding structure 013 is bonded to the second substrate bonding structure 024 through the second alignment opening F.

Optionally, referring to FIG. 12, FIG. 13, FIG. 16, and FIG. 17 and in combination with FIG. 1 to FIG. 7, the size of the first chip bonding structure 012 is less than the size of the first alignment opening K, and the size of the second chip bonding structure 013 is less than the size of the second alignment opening F and greater than the size of the first alignment opening K. The distance d1 between the first chip bonding structure 012 and the second chip bonding structure 013 is equal to the distance d2 between the first alignment the opening K and the second alignment opening F.

Optionally, referring to FIG. 12, FIG. 13, FIG. 16, and FIG. 17 and in combination with FIG. 1 to FIG. 7, the first alignment opening K is an alignment hole, and the second alignment opening F is an alignment slit. The size of the chip bonding structure 012 is less than the aperture DK of the first alignment opening K, and the size of the second chip bonding structure 013 is less than the width wF of the second alignment opening F and greater than the aperture DK of the first alignment opening. In this way, it is convenient for the first chip bonding structure 012 to enter the first alignment opening K, and it is convenient for the second chip bonding structure 013 to enter the second alignment opening F but cannot enter the first alignment opening K, thereby ensuring that the first chip bonding structure 012 is bonded to the first substrate bonding structure 023 through the first alignment opening K, and the second chip bonding structure 013 is bonded to the second substrate bonding structure 024 through the second alignment opening F.

Optionally, referring to FIG. 12, FIG. 13, FIG. 16, and FIG. 17 and in combination with FIG. 5 to FIG. 7, the orthogonal projection of the first substrate bonding structure 023 on the alignment layer 022 covers the first alignment opening K. The orthogonal projection of the second substrate bonding structure 024 on the alignment layer 022 covers the second alignment opening F. In this way, the first substrate bonding structure 023 can be exposed as much as possible through the first alignment opening K and be in contact with the chip bonding structure 012. The second substrate bonding structure 024 can be exposed as much as possible through the second alignment opening F and be in contact with the second chip bonding structure 013, thereby ensuring effective bonding of the chip 01 and the target substrate 02.

Optionally, referring to FIG. 12 and FIG. 13 and in combination with FIG. 1, FIG. 2, and FIG. 5 to FIG. 7, the first chip bonding structure 012, the second chip bonding structure 013, and the first substrate bonding structure 023 may be all columnar structures, the second substrate bonding structure 024 may be a ring-shaped structure, the first alignment opening K may be an alignment hole, and the second alignment opening F may be a ring-shaped alignment slit. The first substrate bonding structure 023 may be located at the center of the ring shape of the second substrate bonding structure 024, and the first alignment opening K may be located at the center of the ring shape of the second alignment opening F. The size of the bottom surface of the first chip bonding structure 012 may be less than the aperture DK of the first alignment opening K, and the size of the bottom surface of the second chip bonding structure 013 may be greater than the aperture DK of the first alignment opening K and less than the width wF of the second alignment opening F. In this way, it is convenient for the first chip bonding structure 012 to enter the first alignment opening K, and it is convenient for the second chip bonding structure 013 to enter the second alignment opening F. The height h012 of the first chip bonding structure 012 and the height h013 of the second chip bonding structure 013 may be equal, and the height h023 of the first substrate bonding structure 023 and the height h024 of the second substrate bonding structure 024 may be equal. Then, when the first chip bonding structure 012 is in contact with the first substrate bonding structure 023, the second chip bonding structure 013 is in contact with the second substrate bonding structure 024.

Optionally, as shown in FIG. 5 and FIG. 6, the shape of the opening surface of the first alignment opening K may be the same as the shape of the bottom surface of the first substrate bonding structure 023, and the aperture DK of the first alignment opening K may be less than or equal to the size of the bottom surface of the first substrate bonding structure 023. The shape of the opening surface of the second alignment opening F may be the same as the ring shape of the second substrate bonding structure 024. The width wF of the second alignment opening F may be less than or equal to the width of the second substrate bonding structure 024, thereby ensuring that the first chip bonding structure 012 is in full contact with the first substrate bonding structure 023, and the second substrate bonding structure 024 is in full contact with the second substrate bonding structure 024.

Optionally, with reference to FIG. 1, FIG. 2, FIG. 5, and FIG. 6, the first chip bonding structure 012, the second chip bonding structure 013, and the first substrate bonding structure 023 may be all cylindrical structures. The second substrate bonding structure 024 may be a circular ring-shaped structure, the first alignment opening K may be a circular alignment hole, and the second alignment opening F may be a circular ring-shaped alignment slit. The diameter D012 of the first chip bonding structure 012 may be less than the aperture DK of the first alignment opening K, and the diameter D013 of the second chip bonding structure 013 may be greater than the aperture DK of the first alignment opening K and less than the width wF of the second alignment opening F. The aperture DK of the first alignment opening K may be less than or equal to the diameter D023 of the first substrate bonding structure 023, and the width wF of the second alignment opening F may be less than or equal to the width w024 of the second substrate bonding structure 024.

Optionally, referring to FIG. 12 and FIG. 13 and in combination with FIG. 1 and FIG. 2, the chip 01 further includes a weight body 014 distributed in the same layer as the second chip bonding structure 013. The weight body 14 is configured to enable the center of gravity the chip 01 to be coincided with the center of the chip 01. Optionally, the longitudinal axis cross sections of the first chip bonding structure 012, the second chip bonding structure 013, and the weight body 014 are coplanar.

Optionally, referring to FIG. 16 and FIG. 17 and in combination with FIG. 3 to FIG. 7, the first chip bonding structure 012 and the first substrate bonding structure 023 are both columnar structures, and the second chip bonding structure 013 and the second substrate bonding structure 024 are both ring-shaped structures. The first alignment opening K is an alignment hole, the second alignment opening F is a ring-shaped alignment slit, and the first chip bonding structure 012 is located at the center of the ring shape of the second chip bonding structure 013. The first substrate bonding structure 023 is located in the center of the ring shape of the second substrate bonding structure 024. The first alignment opening K is located in the center of the ring shape of the second alignment opening F. The size of the bottom surface of the first chip bonding structure 012 is less than the aperture DK of the first alignment opening K, and the width w013 of the second chip bonding structure 013 is less than the width wF of the second alignment opening F. In this way, it is convenient for the first chip bonding structure 012 to enter the first alignment opening K, and it is convenient for the second chip bonding structure 013 to enter the second alignment opening F. The height h012 of the first chip bonding structure 012 is equal to the height h013 of the second chip bonding structure 013, and the height h023 of the first substrate bonding structure 023 is equal to the height h024 of the second substrate bonding structure 024. In this way, it is convenient for the first chip bonding structure 012 to be in contact with the first substrate bonding structure 023 while the second chip bonding structure 013 is in contact with the second substrate bonding structure 024.

Optionally, referring to FIG. 16 and FIG. 17 and in combination with FIG. 3 to FIG. 7, the shape of the opening surface of the first alignment opening K is the same as the shape of the bottom surface of the first substrate bonding structure 023, and the aperture DK of the first alignment opening K is less than or equal to the size of the bottom surface of the first substrate bonding structure 023. The shape of the opening surface of the second alignment opening F is the same as the ring shape of the second substrate bonding structure 024, and the width wF of the second alignment opening F is less than or equal to the width w024 of the second substrate bonding structure 024, thereby ensuring that the first chip bonding structure 012 is in full contact with the first substrate bonding structure 023, and the second chip bonding structure 013 is in full contact with the second substrate bonding structure 024.

Optionally, referring to FIG. 16 and FIG. 17 in combination with FIG. 3 to FIG. 7, the first chip bonding structure 012 and the first substrate bonding structure 023 are both cylindrical structures, and the second chip bonding structure 013 and the second substrate bonding structure 024 are both circular ring-shaped structures. The first alignment opening K is a circular alignment hole, and the second alignment opening F is a circular ring-shaped alignment slit. The diameter D012 of the first chip bonding structure 012 is less than the aperture DK of the first alignment opening K, and the width w013 of the second chip bonding structure 013 is less than the width wF of the second alignment opening F. The aperture DK of the first alignment opening K is less than or equal to the diameter D023 of the first substrate bonding structure 023, and the width wF of the second alignment opening F is less than or equal to the width of the second substrate bonding structure 024.

The character "/" in the present disclosure generally indicates that the related objects are in an "or" relationship.

In the present disclosure, "electrical connection" refers to a connection and a charge can transfer, but the charge transfer does not necessarily exist. For example, the electrical connection between A and B means that A and B are connected and a charge can be transferred between A and B, but the charge transfer does not necessarily exist between A and B.

Persons of ordinary skill in the art can understand that all or part of the steps described in the above embodiments can be completed through hardware, or through relevant hardware instructed by applications stored in a non-transitory computer readable storage medium, such as a read-only memory, a disk or a CD, etc.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A chip transfer method, comprising:
    disposing a target substrate in a closed cavity, the target substrate comprising a first alignment bonding structure and a second alignment bonding structure;
    applying a charge of a first polarity to the first alignment bonding structure of the target substrate;
    applying a charge of a second polarity to a first chip bonding structure of a chip, wherein the chip comprises a second chip bonding structure and the first chip bonding structure, and the second polarity and the first polarity are different;
    injecting an insulating fluid into the closed cavity to suspend the chip in the insulating fluid within the closed cavity, wherein under an action of the first chip bonding structure and the first alignment bonding structure, the chip moves close to the target substrate, the first chip bonding structure is caused to be in contact with the first alignment bonding structure, and the second chip bonding structure is caused to be in contact with the second alignment bonding structure; and
    applying a bonding force to the chip, wherein the first chip bonding structure is caused to be bonded to the first alignment bonding structure, and the second chip bonding structure is caused to be bonded to the second alignment bonding structure.

2. The method according to claim 1, wherein the method further comprises:
    applying the charge of the first polarity to the second alignment bonding structure of the target substrate, and applying the charge of the second polarity to the second chip bonding structure of the chip; or,
    grounding the second alignment bonding structure of the target substrate, and applying the charge of the second polarity to the second chip bonding structure of the chip.

3. The method according to claim 1, wherein
    the injecting the insulating fluid into the closed cavity to suspend the chip in the insulating fluid within the closed cavity comprises:
    disposing the chip in the closed cavity and injecting the insulating fluid into the closed cavity to suspend the chip in the insulating fluid within the closed cavity; or,
    mixing the chip with the insulating fluid and injecting the insulating fluid mixed with the chip into the closed cavity to suspend the chip in the insulating fluid within the closed cavity.

4. The method according to claim 1, wherein
    before injecting the insulating fluid into the closed cavity to suspend the chip in the insulating fluid within the closed cavity, the method further comprises:

separating the chip from the source substrate.

5. The method according to claim 1, wherein
the target substrate comprises a bonding layer and an alignment layer which are laminated, the bonding layer comprises a first substrate bonding structure and a second substrate bonding structure, the alignment layer has a first alignment opening and a second alignment opening, the first alignment bonding structure comprises the first substrate bonding structure and the first alignment opening, and the second alignment bonding structure comprises the second substrate bonding structure and the second alignment opening, and
the applying the charge of the first polarity to the first alignment bonding structure of the target substrate comprises:
applying the charge of the first polarity to the first substrate bonding structure of the target substrate, wherein under the action of the first chip bonding structure and the first substrate bonding structure, the chip moves close to the target substrate, the first chip bonding structure enters the first alignment opening and is in contact with the first substrate bonding structure, and the second chip bonding structure enters the second alignment opening and is in contact with the second substrate bonding structure.

6. A display device comprising a chip and a target substrate, wherein
the chip comprises a chip main body, and a first chip bonding structure and a second chip bonding structure which are located at the chip main body;
the target substrate comprises a base substrate, and a first alignment bonding structure and a second alignment bonding structure which are located at the base substrate; and
the first chip bonding structure is bonded to the first alignment bonding structure, and the second chip bonding structure is bonded to the second alignment bonding structure; and
wherein the target substrate comprises a bonding layer and an alignment layer which are laminated, the bonding layer comprises a first substrate bonding structure and a second substrate bonding structure the alignment layer has a first alignment opening and a second alignment opening, the first alignment bonding structure comprises the first substrate bonding structure and the first alignment opening and the second alignment bonding structure comprises the second substrate bonding structure and the second alignment opening; and
the first chip bonding structure is bonded to the first substrate bonding structure through the first alignment opening, and the second chip bonding structure is bonded to the second substrate bonding structure through the second alignment opening; and
wherein the first chip bonding structure, the second chip bonding structure and the first substrate bonding structure are all columnar structures, the second substrate bonding structure is a ring-shaped structure, the first alignment opening is an alignment hole the second alignment opening is a ring-shaped alignment slit, the first substrate bonding structure is located at a center of a ring shape of the second substrate bonding structure, and the first alignment opening is located at a center of a ring shape of the second alignment opening;
a size of a bottom surface of the first chip bonding structure is less than an aperture of the first alignment opening, and a size of a bottom surface of the second chip bonding structure is greater than the aperture of the first alignment opening and less than a width of the second alignment opening;
a height of the first chip bonding structure is equal to a height of the second chip bonding structure, and a height of the first substrate bonding structure is equal to a height of the second substrate bonding structure;
a shape of an opening surface of the first alignment opening is the same as a shape of a bottom surface of the first substrate bonding structure, and the aperture of the first alignment opening is less than or equal to the size of the bottom surface of the first substrate bonding structure; and
a shape of an opening surface of the second alignment opening is the same as the ring shape of the second substrate bonding structure, and the width of the second alignment opening is less than or equal to a width of the second substrate bonding structure.

7. The display device according to claim 6, wherein
a size of the first chip bonding structure is less than that of the first alignment opening, a size of the second chip bonding structure is less than that of the second alignment opening and greater than that of the first alignment opening, and a distance between the first chip bonding structure and the second chip bonding structure is equal to a distance between the first alignment opening and the second alignment opening.

8. The display device according to claim 7, wherein
the first alignment opening is an alignment hole, the second alignment opening is an alignment slit, the size of the first chip bonding structure is less than an aperture of the first alignment opening, and the size of the second chip bonding structure is less than a width of the second alignment opening and greater than the aperture of the first alignment opening.

9. The display device according to claim 6, wherein
an orthogonal projection of the first substrate bonding structure on the alignment layer covers the first alignment opening, and an orthogonal projection of the second substrate bonding structure on the alignment layer covers the second alignment opening.

10. The display device according to claim 6, wherein
the first chip bonding structure, the second chip bonding structure, and the first substrate bonding structure are all cylindrical structures, the second substrate bonding structure is a circular ring-shaped structure, the first alignment opening is a circular alignment hole, and the second alignment opening is a circular ring-shaped alignment slit;
a diameter of the first chip bonding structure is less than the aperture of the first alignment opening, and a diameter of the second chip bonding structure is greater than the aperture of the first alignment opening and less than the width of the second alignment opening; and
the aperture of the first alignment opening is less than or equal to a diameter of the first substrate bonding structure, and the width of the second alignment opening is less than or equal to the width of the second substrate bonding structure.

11. The display device according to claim 6, wherein
the chip further comprises a weight body distributed in the same layer as the second chip bonding structure, and the weight body is configured to enable a center of gravity of the chip to be coincided with a center of the chip.

12. The display device according to claim 11, wherein longitudinal axis cross sections of the first chip bonding structure, the second chip bonding structure, and the weight body are coplanar.

13. The display device according to claim 6, wherein
the first chip bonding structure and the first substrate bonding structure are both columnar structures, the second chip bonding structure and the second substrate bonding structure are both ring-shaped structures, the first alignment opening is an alignment hole, the second alignment opening is a ring-shaped alignment slit, the first chip bonding structure is located at a center of a ring shape of the second chip bonding structure, the first substrate bonding structure is located at a center of a ring shape of the second substrate bonding structure, and the first alignment opening is located at a center of a ring shape of the second alignment opening;

a size of a bottom surface of the first chip bonding structure is less than an aperture of the first alignment opening, and a width of the second chip bonding structure is less than a width of the second alignment opening;

a height of the first chip bonding structure is equal to a height of the second chip bonding structure, and a height of the first substrate bonding structure is equal to a height of the second substrate bonding structure;

a shape of an opening surface of the first alignment opening is the same as a shape of a bottom surface of the first substrate bonding structure, and the aperture of the first alignment opening is less than or equal to the size of the bottom surface of the first substrate bonding structure; and a shape of an opening surface of the second alignment opening is the same as the ring shape of the second substrate bonding structure, and the width of the second alignment opening is less than or equal to a width of the second substrate bonding structure.

14. The display device according to claim 13, wherein
the first chip bonding structure and the first substrate bonding structure are both cylindrical structures, the second chip bonding structure and the second substrate bonding structure are both circular ring-shaped structures, the first alignment opening is a circular alignment hole, and the second alignment opening is a circular ring-shaped alignment slit;

a diameter of the first chip bonding structure is less than the aperture of the first alignment opening, and the width of the second chip bonding structure is less than the width of the second alignment opening; and the aperture of the first alignment opening is less than or equal to a diameter of the first substrate bonding structure, and the width of the second alignment opening is less than or equal to the width of the second substrate bonding structure.

15. The display device according to claim 6, wherein the chip main body is a columnar structure, and an axis of the first chip bonding structure is collinear with an axis of the chip main body.

\* \* \* \* \*